US012696582B2

(12) United States Patent
Yu et al.

(10) Patent No.: US 12,696,582 B2
(45) Date of Patent: Jul. 28, 2026

(54) LIGHTING DEVICE HAVING IMPROVED HEAT DISSIPATION CHARACTERISTICS AND LAMP COMPRISING SAME

(71) Applicant: LG INNOTEK CO., LTD., Seoul (KR)

(72) Inventors: Yeong Seok Yu, Seoul (KR); Young Kuk Kwak, Seoul (KR); Do Yub Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 567 days.

(21) Appl. No.: 18/036,724

(22) PCT Filed: Nov. 26, 2021

(86) PCT No.: PCT/KR2021/017584
§ 371 (c)(1),
(2) Date: May 12, 2023

(87) PCT Pub. No.: WO2022/114833
PCT Pub. Date: Jun. 2, 2022

(65) Prior Publication Data
US 2023/0420609 A1 Dec. 28, 2023

(30) Foreign Application Priority Data

Nov. 27, 2020 (KR) ........................ 10-2020-0162169

(51) Int. Cl.
*H10H 20/813* (2025.01)
*H10H 20/814* (2025.01)
(Continued)

(52) U.S. Cl.
CPC ........ *H10H 20/813* (2025.01); *H10H 20/814* (2025.01); *H10H 20/84* (2025.01);
(Continued)

(58) Field of Classification Search
CPC .. H10H 20/813; H10H 20/814; H10H 20/856; B60Q 2400/20; F21S 43/14
(Continued)

(56) References Cited

U.S. PATENT DOCUMENTS 10,017,847 B2 7/2018 Luten et al.
10,145,537 B2 12/2018 Watanabe et al.
(Continued)

FOREIGN PATENT DOCUMENTS

CN 101976009 2/2011
CN 105299557 2/2016
(Continued)

OTHER PUBLICATIONS

Chinese Office Action dated Jun. 19, 2025, issued in Application No. 202180080204.9.
(Continued)

*Primary Examiner* — Ratisha Mehta
*Assistant Examiner* — Mikka Liu
(74) *Attorney, Agent, or Firm* — KED & Associates, LLP

(57) ABSTRACT

A lighting device disclosed in an embodiment of the invention includes a reflective layer, a first resin layer on the reflective layer, a substrate on the first resin layer, a light emitting device between the first resin layer and the substrate, and a second resin layer on the substrate, a half mirror layer on the second resin layer and an optical member between the second resin layer and the half mirror layer, and the light emitted through the light emitting surface of the light emitting device is reflected by the reflective layer and passes through the substrate. The light in the visible light wavelength band includes a first wavelength band and a second wavelength band having different wavelength bands, and the half mirror layer has a reflectance of the light in the first wavelength band of the first wavelength band higher (Continued)

than a transmittance of light in the first wavelength band, and the optical member has a transmittance of light in the first wavelength band higher than a transmittance of light in the second wavelength band.

20 Claims, 15 Drawing Sheets

(51) Int. Cl.
| *H10H 20/84* | (2025.01) |
| *H10H 20/855* | (2025.01) |
| *H10H 29/10* | (2025.01) |
| *H10H 20/01* | (2025.01) |

(52) U.S. Cl.
CPC .......... *H10H 20/855* (2025.01); *H10H 29/10* (2025.01); *H10H 20/036* (2025.01)

(58) Field of Classification Search
USPC ...................................................... 257/88–89
See application file for complete search history.

(56) References Cited

U.S. PATENT DOCUMENTS

| 2007/0052884 A1 | 3/2007 | Creusen | |
| 2010/0265694 A1* | 10/2010 | Kim ..................... | G02B 6/0021 |
| | | | 362/97.1 |
| 2013/0250189 A1* | 9/2013 | Choe ................. | G02F 1/133603 |
| | | | 349/11 |
| 2015/0345740 A1 | 12/2015 | Watanabe et al. | |
| 2020/0025348 A1 | 1/2020 | Jung et al. | |
| 2020/0110309 A1* | 4/2020 | Masuda ........... | G02F 1/133611 |

FOREIGN PATENT DOCUMENTS

| JP | 2009529150 | 8/2009 |
| JP | 2016012554 | 1/2016 |
| KR | 10-2008-0106963 | 12/2008 |
| KR | 10-2013-0107797 | 10/2013 |
| KR | 10-2014-0090293 | 7/2014 |
| KR | 10-2020-0008863 | 1/2020 |
| WO | WO 2020045698 | 3/2020 |

OTHER PUBLICATIONS

Japanese Office Action dated Jun. 20, 2025, issued in Application No. 2023-530641.
European Search Report dated Sep. 17, 2024 issued in Application No. 21898658.6.
International Search Report dated Mar. 22, 2022 issued in Application No. PCT/KR2021/017584.

* cited by examiner

2100

2200

LIGHTING DEVICE HAVING IMPROVED HEAT DISSIPATION CHARACTERISTICS AND LAMP COMPRISING SAME

CROSS-REFERENCE TO RELATED PATENT APPLICATIONS

This application is a U.S. National Stage Application under 35 U.S.C. § 371 of PCT Application No. PCT/KR2021/017584, filed Nov. 26, 2021, which claims priority to Korean Patent Application No. 10-2020-0162169, filed Nov. 27, 2020, whose entire disclosures are hereby incorporated by reference.

TECHNICAL FIELD

The embodiment relates to a lighting device and a lamp comprising same.

BACKGROUND ART

Lighting is a device capable of supplying light or controlling the amount of light and is used in various fields. For example, the lighting device may be applied to various fields such as vehicles and buildings to illuminate the interior or exterior. In particular, in recent years, a light emitting device has been used as a light source for lighting. Such the light emitting device, for example, a light emitting diode (LED), has advantages such as low power consumption, semi-permanent lifespan, fast response speed, safety, environmental friendliness compared to conventional light sources such as fluorescent lamps and incandescent lamps. Such light emitting diodes are being applied to various optical assemblies such as various display devices, indoor lights, or outdoor lights. In general, lamps of various colors and shapes are applied to vehicles, and lamps employing light emitting diodes as light sources for vehicles have recently been proposed. For example, the light emitting diode is applied to vehicle headlights, taillights, direction indicators, and the like. However, the light emitting diode has a problem in that the emission angle of emitted light is relatively small. For this reason, when using a light emitting diode as a vehicle lamp, there is a demand for increasing the light emitting area of the lamp. When the lamp includes the light emitting diode, there is a problem in that the performance of the light emitting diode is deteriorated or the uniformity of emitted light is reduced due to heat generated when the light emitting diode emits light.

When the lamp includes the light emitting diode, there is a problem in that a hot spot is formed by light emitted from the light emitting diode. In this case, when implementing a linear light source or a surface light source using the lamp, there is a problem in that uniformity characteristics of the light emitting surface are deteriorated.

In general, when the light emitting diode is applied to a vehicle lamp, there is a problem in that the light emitting diode is visually recognized from the outside. For example, when the vehicle lamp is turn on, it may not be recognized by the light emitted from the light source, but when the lamp is turn off, the light emitting diode is visible from the outside, and thus, the aesthetics of the lamp and the degree of freedom in design are improved. There is a problem of deterioration of characteristics. Therefore, a new lighting device and lamp capable of solving the above problems are required.

DISCLOSURE

Technical Problem

An embodiment of the invention provides a lighting device and a lamp capable of realizing a uniform line light source or a surface light source. An embodiment provides a lighting device and a lamp having improved aesthetics. An embodiment provides a lighting device and a lamp capable of compensating for a light spectrum of light emitted from a light emitting device. An embodiment provides a lighting device and a lamp having improved heat dissipation characteristics.

Technical Solution

A lighting device according to an embodiment includes a reflective layer, a first resin layer disposed on the reflective layer, a substrate disposed on the first resin layer, a light emitting device disposed between the first resin layer and the substrate, a second resin layer disposed on the substrate, a half mirror layer disposed on the second resin layer, and an optical member disposed between the second resin layer and the half mirror layer, wherein light emitted through a light emitting surface of the light emitting device is reflected by the reflective layer and passes through the substrate, and the light in a visible light wavelength band has a first wavelength band having a partial wavelength band and a second wavelength band with a wavelength band different from the first wavelength band, wherein the half mirror layer may have a higher reflectance of light in the first wavelength band than the light in the first wavelength band, and the optical member may have a higher transmittance of light in the first wavelength band than the light in the second wavelength band.

According to an embodiment of the invention, the optical member may include a first optical layer disposed between the second resin layer and the half mirror layer, and a second optical layer disposed between the first optical layer and the half mirror layer. The second wavelength band includes a second-first wavelength band and a second-second wavelength band different from the second-first wavelength band, and the first optical layer may have a higher transmittance to light in the second-first wavelength band than the light in the second-second wavelength band, and the second optical layer may have a transmittance to light in the second-second wavelength band than the light in the second-first wavelength band. Each of the first and second optical layers may have a thickness of 150 μm or less. The light emitting device may include a plurality of light emitting devices spaced apart from each other, and each of the plurality of light emitting devices may emit white light.

According to an embodiment of the invention, a light blocking layer disposed between the substrate and the optical member may be further included. The light blocking layer may include a plurality of light blocking patterns formed on at least one of upper and lower surfaces of the light blocking layer, and a portion of the light blocking patterns may be disposed on a region overlapping the light emitting device in a vertical direction.

A lighting device according to an embodiment a reflective layer, a first resin layer disposed on the reflective layer, a substrate disposed on the first resin layer, and a light emitting device disposed between the first resin layer and the substrate, a second resin layer disposed on the substrate, a half mirror layer disposed on the second resin layer, and an optical member disposed between the reflective layer and the first resin layer, wherein light emitted through a light emitting surface of the light emitting device passes through the optical member, is reflected by the reflective layer and passes through the substrate, and the light in a visible light wavelength band has a first wavelength band having a partial wavelength band and a second wavelength band having other wavelength bands other than the first wavelength band, the half mirror layer may have a higher reflectance of light in the first wavelength band than the light in the first wavelength band, and the optical member may have a higher transmittance of light in the first wavelength band than the light in the second wavelength band.

According to an embodiment of the invention, the optical member may include a first optical layer disposed between the reflective layer and the first resin layer, and a second optical layer disposed between the first optical layer and the first resin layer. The second wavelength band includes a second-first wavelength band and a second-second wavelength band different from the second-first wavelength band, and the first optical layer has transmittance for light in the second-first wavelength band higher than the transmittance of light in the second-second wavelength band, and the second optical layer has a transmittance of light in the second-second wavelength band higher than the transmittance of light in the second-first wavelength band.

A lighting device according to an embodiment includes a reflective layer, a first resin layer disposed on the reflective layer, a substrate disposed on the first resin layer, and light emitting device disposed between the first resin layer and the substrate, a second resin layer disposed on the substrate, and a half mirror layer disposed on the second resin layer, and light emitted through a light emitting surface of the light emitting device is reflected by the reflective layer and passes through the substrate, the light emitting devices are disposed adjacent to each other and include first to third light emitting devices forming a unit light emitting group, the first light emitting devices emit red light, and the second light emitting devices emit green light, and the third light emitting devices emits blue light, and the light in the visible light wavelength band includes a first wavelength band having a partial wavelength band and a second wavelength band having different wavelength band from the first wavelength band, and the half mirror layer may have a reflectance with respect to light in the first wavelength band higher than a transmittance with respect to light in the first wavelength band.

According to an embodiment of the invention, when the half mirror layer has a first color corresponding to the first wavelength band and the first color is red, the second light emitting device emits light having a luminous intensity lower than that of the first light emitting device and the light passing through the half mirror layer may be white.

Advantageous Effects

Lighting device and lamp according to embodiments may have improved light characteristics. In detail, the lighting device and the lamp include a substrate, a reflective layer, a first resin layer, a second resin layer, and the like, and the components may have a set thickness. Accordingly, the light emitted from the light emitting device and emitted to the outside of the lighting device may have a uniform luminance. Accordingly, the lighting device and the lamp may provide a line light source or a surface light source having improved light characteristics.

In the lighting device and the lamp according to the embodiment, light emitted from the light emitting device may be emitted in an indirect light method in which light emitted from the light emitting device is reflected to other internal components instead of being directly emitted. Accordingly, it is possible to prevent the light emitting device from being directly viewed from the outside, and to secure a light guiding distance for uniform luminance.

The lighting device and the lamp according to the embodiment may prevent or minimize the occurrence of a hot spot phenomenon in which light emitted from a light emitting device is concentrated. In detail, the lighting device and the lamp may control concentration of light by controlling at least one of a half mirror layer and a light blocking pattern of a light blocking layer. Accordingly, the lighting device and the lamp may provide light having uniform luminance.

Lighting device and lamp according to embodiments may have improved heat dissipation characteristics. In detail, the lighting device includes an electrode layer disposed in a set pattern, and the electrode layer may effectively dissipate heat emitted from the light emitting device. Accordingly, the lighting device and the lamp according to the embodiment may have improved reliability and uniform characteristics even when driven for a long time.

A lighting device and a lamp according to an embodiment may have a hidden effect. In detail, the lighting device and the lamp may include a half mirror layer having a color identical to or similar to that of the surrounding region. Accordingly, when the lighting device and the lamp are turned off, the lighting device and the lamp may not be recognized or may be minimized. In addition, the lighting device and the lamp may include an optical member, and the optical member may compensate for a light spectrum changed by the half mirror layer. Accordingly, when the lighting device and the lamp are turned on, the color of the light emitted from the lighting device and the lamp may be prevented from being changed by the half mirror layer and may be the same or similar to the color of the light emitted from the light emitting device. Accordingly, the lighting device and the lamp according to the embodiment may have improved aesthetics and design freedom.

BEST MODE

Figure 1:
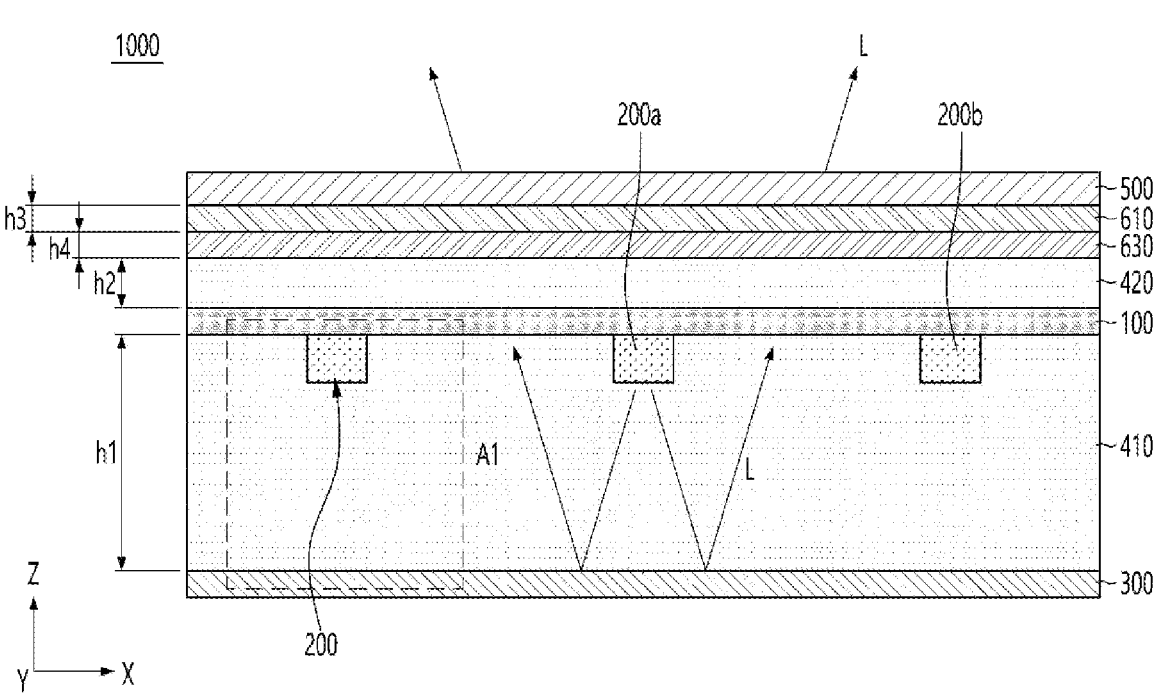
FIG. 1 is a cross-sectional view of a lighting device according to an embodiment.

Hereinafter, preferred embodiments of the invention will be described in detail with reference to the accompanying drawings.

The technical idea of the invention is not limited to some of the described embodiments, but can be implemented in various different forms, and when it is within the scope of the technical idea of the invention, one or more of its components may be selectively combined and substituted between embodiments. In addition, terms (including technical and scientific terms) used in the embodiments of the invention, unless explicitly specifically defined and described, may be interpreted as a meaning that may be generally understood by those skilled in the art to which the invention belongs, and terms generally used, such as terms defined in the dictionary, may be interpreted in consideration of the context of the related technology. Also, terms used in the embodiments of the invention are for describing the embodiments and are not intended to limit the invention. In the present specification, the singular form may include a plural form unless specifically described in the phrase, and may include at least one of all combinations that may be combined as A, B, and C when described as "A and/or at least one (or more than one) of B and C". Also, terms such as first, second, A, B, (a), and (b) may be used to describe components of an embodiment of the invention. These terms are intended only to distinguish the components from other components and are not determined by their nature, sequence, or order. Also, when a component is described as being 'connected', 'coupled' or 'connected' to another component, not only when the component is directly connected, coupled or connected to another component, it may also be 'connected', 'coupled', or 'connected' due to another component between that component and the other component. In addition, when each component is described as being formed or disposed "up (above) or down (bottom)", the up (down) or down (bottom) includes not only when two components are in direct contact with each other, but also when one or more components are formed or disposed between two components. Also, when expressed as "up (above) or down (bottom)", it may include the meaning of not only the upward direction but also the downward direction based on one component.

The lighting device according to the embodiment may be applied to various lamp devices that require lighting, such as vehicle lamps, household optical assemblies, and industrial optical assemblies. For example, when applied to vehicle lamps, it can be applied to head lamps, side mirror lamps, side maker light, fog lamps, tail lamps, brake lamps, daytime running lamps, vehicle interior lighting, door scarves, rear combination lamps, backup lamps, etc. In addition, when applied to a vehicle lamp, it can be applied to a rear side assistance system (BSD) disposed in a side mirror or A-pillar. In addition, the optical assembly of this invention may be applied to indoor and outdoor advertising devices, display devices, and various electric vehicle fields, as well as all lighting and advertising fields that are currently developed and commercialized or may be implemented according to future technological advances. In addition, the optical assembly of this invention may be applied to indoor and outdoor advertising devices, display devices, and various electric vehicle fields, as well as all lighting and advertising fields that are currently developed and commercialized or may be implemented according to future technological advances.

In addition, prior to the description of the embodiment, a first direction may mean an x-axis direction shown in the drawing, and a second direction may be a direction different from the first direction. For example, the second direction may mean a y-axis direction shown in the drawing as a direction perpendicular to the first direction and may mean an optical axis direction of a light emitting device. Also, the horizontal direction may mean first and second directions, and the vertical direction may mean a direction perpendicular to at least one of the first and second directions. For example, the horizontal direction may refer to the x-axis and y-axis directions of the drawing, and the vertical direction may refer to the z-axis direction of the drawing, perpendicular to the x-axis and y-axis directions.

Figure 2:
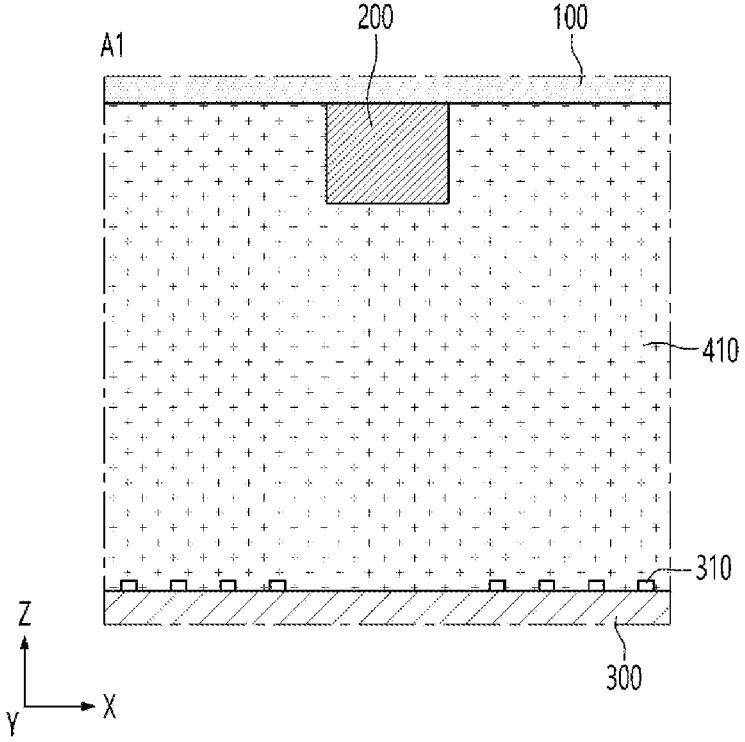
FIG. 2 is an enlarged view of a region A1 of FIG. 1.
Figure 3:
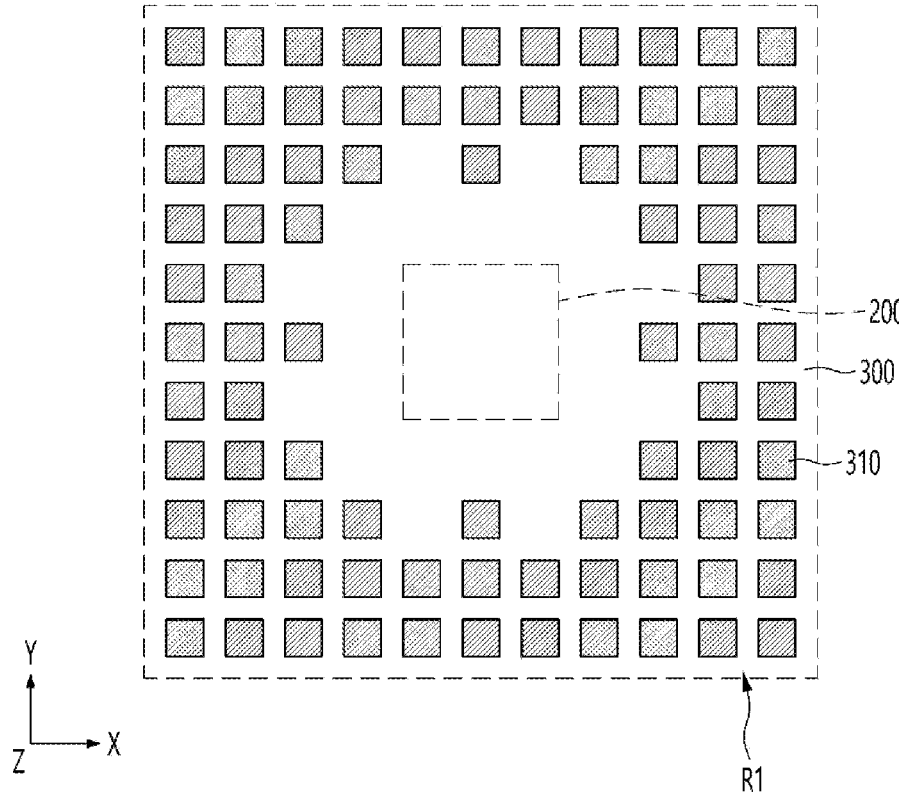
FIG. 3 is a plan view of a reflective layer according to the embodiment.
Figure 4:
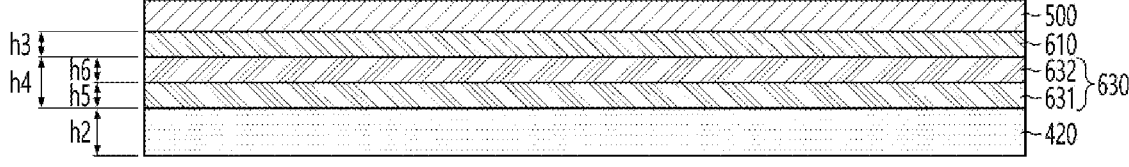
FIG. 4 is an enlarged view of an optical member according to the embodiment.
Figure 4:
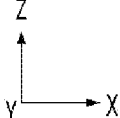

FIG. 1 is a cross-sectional view of a lighting device according to an exemplary embodiment, and FIG. 2 is an enlarged view of a region A1 of FIG. 1, FIG. 3 is a plan view of a reflective layer according to the embodiment, and FIG. 4 is an enlarged view of an optical member according to the embodiment.

Referring to FIGS. 1 to 4, the lighting device 1000 according to the embodiment includes a substrate 100, a light emitting device 200, a reflective layer 300, a first resin layer 410, and a second resin layer 420, a half mirror layer 610 and an optical member 630. The lighting device 1000 may emit light emitted from the light emitting device 200 as a surface light source. The lighting device 1000 may be defined as a light emitting cell, a lighting module, or a light source module. The lighting device 1000 may include one light emitting cell or a plurality of light emitting cells on the substrate 100. The lighting device 1000 may emit light emitted from the light emitting device 200 as a surface light source. The lighting device 1000 may include one light emitting cell or a plurality of light emitting cells on the substrate 100.

The substrate 100 may include a light-transmissive material. The substrate 100 may include a material through which light is transmitted through upper and lower surfaces. The substrate 100 may be a transparent substrate. The substrate 100 may include at least one of polyethylene terephthalate (PET), polystyrene (PS), polyimide (PI), polyethylene naphthalate (PEN), and polycarbonate (PC). The substrate 100 may have a thickness of 20 μm or more, for example, in the range of 20 μm to 300 μm. In detail, the substrate 100 may have a thickness of 30 μm to 250 μm. In more detail, the substrate 100 may have a thickness of 50 μm to 200 μm. When the substrate 100 has a thickness of less than 20 μm, it may be difficult to effectively support a component disposed on the substrate 100, for example, a weight of the light emitting device 200 may cause a problem in which one region of the substrate 100 on which the light emitting device 200 is disposed is drooped. Accordingly, the reliability of the substrate 100 may deteriorate, and an alignment problem of the light emitting device 200 disposed on the substrate 100 may occur. When the thickness of the substrate 100 exceeds 300 μm, the total thickness of the lighting device 1000 may increase and flexibility of the substrate 100 may decrease. In addition, when the thickness of the substrate 100 exceeds 300 μm, a path of light emitted by the thickness of the substrate 100 may change, and as a result, it may be difficult to implement a uniform surface light source.

An electrode layer (not shown) may be disposed on the substrate 100. It may be disposed on the lower surface of the substrate 100. In detail, the electrode layer may be disposed on the lower surface of the substrate 100 facing the first resin layer 410. The electrode layer may include a first electrode (not shown) and a second electrode (not shown). The first electrode and the second electrode may be spaced apart from each other on the lower surface of the substrate 100. For example, the first electrode and the second electrode may be spaced apart in a first direction with respect to the light emitting device 200. Accordingly, the first electrode and the second electrode may be electrically separated from each other. The first electrode and the second electrode may include a conductive material. For example, the first electrode and the second electrode may include at least one of aluminum (Al), copper (Cu), silver (Ag), gold (Au), chromium (Cr), nickel (Ni), molybdenum (Mo), titanium (Ti) and alloys thereof, carbon, and conductive polymers. The first electrode and the second electrode may be a transparent conductive material, and may include, for example, at least one of indium tin oxide (ITO), indium zinc oxide (IZO), indium zinc tin oxide (IZTO), indium aluminum zinc oxide (IAZO), indium gallium zinc (IGZO), or indium zinc oxide (IGZO), indium gallium tin oxide (IGTO), aluminum zinc oxide (AZO), antimony tin oxide (ATO), and gallium zinc oxide (GZO). The first electrode and the second electrode may provide current to the light emitting device 200. For example, the first electrode may provide a current having a first polarity to the light emitting device 200, and the second electrode may provide a second polarity opposite to the first polarity to the light emitting device 200. of current may be provided.

The first electrode and the second electrode may have a shape set on the substrate 100. For example, each of the first and second electrodes may include a plurality of sub-wires extending in different directions. The plurality of sub-wires may have set line widths and may be arranged in a mesh shape crossing each other on the substrate 100. Accordingly, an opening formed by the plurality of sub-wires may be formed on the substrate 100. Here, the opening is a region where the first and second electrodes are not disposed, and light provided to the substrate 100 may travel toward the upper or lower surface of the substrate 100 through the opening. That is, the first electrode and the second electrode form an opening having a set shape and size so that the light emitted from the light emitting device 200 may be smoothly emitted in an upward direction, and a path through which the heat generated from the light emitting device 200 may be effectively radiated may be provided. Accordingly, the lighting device 1000 may have improved light emission and heat dissipation characteristics.

The light emitting device 200 may be disposed on the substrate 100. For example, the light emitting device 200 may be disposed on the lower surface of the substrate 100. The light emitting device 200 may be disposed facing the reflective layer 300 to be described later. The light emitting device 200 includes an LED chip emitting light on at least five sides, and may be disposed on the substrate 100 in a flip chip form. Alternatively, the light emitting device 200 may be a lateral chip or a vertical chip. In the lateral chip, two different electrodes may be disposed in a horizontal direction, and in the vertical chip, two different electrodes may be disposed in a vertical direction. Since the light emitting device 200 is connected to another chip or wiring pattern with a wire in the case of the horizontal type chip or the vertical type chip, the thickness of the module may be increased due to the height of the wire, and the pad space for bonding the wire may be required. The light emitting device 200 may include a package in which an LED chip is packaged. The LED chip may emit at least one of blue, red, green, ultraviolet (UV), and infrared light, and the light emitting device 200 may emit at least one of white, blue, red, green, and infrared light. The light emitting device 200 may be a top view type in which a bottom portion is electrically connected to the substrate 100. An optical axis of the light emitting device 200 may be perpendicular to the lower surface of the substrate 100.

The light emitting device 200 may be electrically connected to the electrode layer. For example, the light emitting device 200 may be electrically connected to the first electrode and the second electrode on the substrate 100 by the substrate 100 and a conductive bonding member (not shown). The conductive bonding member may be a solder material or a metal material. A plurality of light emitting devices 200 may be disposed on the substrate 100. For example, the plurality of light emitting devices 200a and 200b spaced apart in a first direction (x-axis direction) may be disposed on the substrate 100 as shown in FIG. 1. In addition, although not shown in the drawings, the plurality of light emitting devices 200 spaced apart in a second direction (y-axis direction) may be disposed on the substrate 100. For example, when viewed from a plane, the plurality of light emitting devices 200 may be arranged in rows a*columns b (a and b are natural numbers that are equal to or different from each other).

The light emitting device 200 may include a light emitting surface from which light is emitted. A light emitting surface of the light emitting device 200 may face an upper surface of the reflective layer 300. The light emitting surface may be parallel to the upper surface of the reflective layer 300. The light emitting surface of the light emitting device 200 may emit light with the highest intensity in the third direction (z-axis direction), for example, toward the upper surface of the reflective layer 300. The light emitting surface may be a vertical plane or may include a concave or convex surface.

The light emitting device 200 may emit light toward the reflective layer 300. For example, light emitted through the light emitting surface of the light emitting device 200 may be provided to the reflective layer 300. The light provided to the reflective layer 300 may be reflected by the reflective layer 300 and emitted in the direction of the substrate 100, and the light passing through the substrate 100 may have a form of a line light source or a surface light source. That is, the lighting device 1000 may be an indirect lighting device. Accordingly, it is possible to prevent the light emitting device 200 from being visually recognized from the outside. In this case, the optical axis of the light emitting device 200 may be perpendicular to the lower surface of the substrate 100. Also, an optical axis of the light emitting device 200 may be perpendicular to the upper surface of the reflective layer 300.

The reflective layer 300 may be disposed on the substrate 100. In detail, the reflective layer 300 may be disposed on the lower surface of the substrate 100. The reflective layer 300 may be disposed lower than the lower surface of the substrate 100 and the light emitting device 200. The reflective layer 300 is spaced apart from the substrate 100 and the light emitting device 200 and may be disposed to face a light emitting surface of the light emitting device 200. The reflective layer 300 may have an area greater than or equal to that of the lower surface of the substrate 100. The reflective layer 300 may include a film layer (not shown). The film layer may be provided in the form of a film having a metallic material or a non-metallic material. The metallic material may include a metal such as aluminum, silver, or gold. The non-metallic material may include a plastic material or a resin material. The plastic material may be any one selected from the grouping consisting of polyethylene, polypropylene, polystyrene, polyvinyl chloride, polybiphenyl chloride, polyethylene terephthalate, polyvinyl alcohol, polycarbonate, polybutylene terephthalate, polyethylene naphthalate, polyamide, polyacetal, polyphenylene ether, polyamideimide, polyetherimide, polyetheretherketone, polyimide, polytetrafluoroethylene, liquid crystal polymer, fluororesin, copolymers thereof, and mixtures thereof. As the resin material, a reflective material such as $TiO_2$, $Al_2O_3$, or $SiO_2$ may be added to silicon or epoxy. The film layer may be implemented as a single layer or multiple layers, and light reflection efficiency may be improved by such a layer structure. In addition, the film layer may be provided in a color. In detail, the film layer may be provided in a color having low light absorption and excellent light reflection properties. For example, the film layer may be provided in white with excellent light reflection properties. In detail, the film layer may be formed of white polyethylene naphthalate.

The reflective layer 300 may have a thickness of 50 μm or more, for example, a thickness ranging from 50 μm to 500 μm. In detail, the reflective layer 300 may have a thickness of 80 μm to 400 μm. In more detail, the reflective layer 300 may have a thickness of 100 μm to 300 μm. When the thickness of the reflective layer 300 is less than 50 μm, light reflection characteristics of the reflective layer 300 may be deteriorated and reliability of the lighting device 1000 may be deteriorated. Also, when the thickness of the reflective layer 300 exceeds 500 μm, the overall thickness of the lighting device 1000 may increase, and as a result, the flexibility of the lighting device 1000 may deteriorate. Preferably, the thickness of the reflective layer 300 may be 80 μm to 350 μm in consideration of reliability and light reflection characteristics.

The reflective layer 300 may include a reflective pattern 310. The reflective pattern may have a plurality of dot shapes. The plurality of reflective patterns 310 may be disposed on a lower surface of the substrate 100 and an upper surface of the reflective layer 300 facing the light emitting device 200. The plurality of reflective patterns 310 may be disposed on the upper surface of the reflective layer 300 in a protruding form. For example, the reflective pattern 310 may be disposed on the upper surface of the reflective layer 300 in a form protruding toward the light emitting device 200.

The plurality of reflective patterns 310 may be spaced apart from each other in a first direction and a second direction, and may be disposed in a region that does not correspond to the light emitting device 200. In detail, the plurality of reflective patterns 310 may be disposed in a region that does not overlap with the light emitting device 200 in a vertical direction (third direction, z-axis direction). The plurality of reflective patterns 310 may be formed through a printing process. For example, the plurality of reflective patterns 310 may include reflective ink. The plurality of reflective patterns 310 may be printed with a material including any one of $TiO_2$, $CaCO_3$, $BaSO_4$, $Al_2O_3$, Silicon, and PS. The material of the reflective pattern 310 may be white with excellent reflective properties. When viewed from above, the plurality of reflective patterns 310 may have various shapes such as circular, elliptical, and polygonal shapes. In addition, each of the plurality of reflective patterns 310 may have a hemispherical cross section or a polygonal shape. The dot pattern density of the plurality of reflective patterns 310 may change as the distance from the region corresponding to the light emitting device 200 increases. For example, the density of the plurality of reflective patterns 310 may increase as the distance from an overlapping region perpendicularly overlapping the light emitting device 200 on the upper surface of the reflective layer 300 increases. That is, the density of the plurality of reflective patterns 310 may increase as the distance from the optical axis of the light emitting device 200 in the horizontal direction increases. In addition, the size of each of the plurality of reflective patterns 310 may change as the distance from the overlapping region increases. For example, a horizontal width of each of the plurality of reflective patterns 310 may increase as the distance from the overlapping area increases. The width of each of the reflective patterns 310 may increase as the distance from the optical axis of the light emitting device 200 in the horizontal direction increases. That is, as the plurality of reflective patterns 310 are disposed on the upper surface of the reflective layer 300 that does not overlap with the light emitting device 200, the reflective layer 300 may be improved the reflectance of light emitted from the light emitting device 200. Therefore, the lighting device 1000 may reduce the loss of light emitted to the outside through the open region where the electrode layer is not disposed on the substrate 100 and may improve the luminance of the surface light source.

The first resin layer 410 may be disposed on the substrate 100. The first resin layer 410 may be disposed on the lower surface of the substrate 100. The first resin layer 410 may be disposed between the substrate 100 and the reflective layer 300. The first resin layer 410 may be disposed between the lower surface of the substrate 100 and the upper surface of the reflective layer 300. The first resin layer 410 may be disposed on the entire or partial region of the lower surface of the substrate 100. The first resin layer 410 may be formed of a transparent material. The first resin layer 410 may include a resin material such as silicone or epoxy. The first resin layer 410 may selectively include a thermosetting resin material, for example, PC, OPS, PMMA, or PVC. The first resin layer 410 may be made of glass, but is not limited thereto. For example, a resin material containing urethane acrylate oligomer as a main material may be used as the main material of the first resin layer 410. For example, a mixture of synthetic oligomer, urethane acrylate oligomer, and polyacrylic polymer type may be used. Of course, it may further include a monomer mixed with low-boiling dilute reactive monomers such as IBOA (isobornyl acrylate), HPA (Hydroxylpropyl acrylate, 2-HEA (2-hydroxyethyl acrylate)), etc., and a photoinitiator (e.g., 1-hydroxy cyclohexyl phenyl-ketone, etc.) or antioxidants, etc. Since the first resin layer 410 is provided as a layer for guiding light with resin, it can be provided with a thinner thickness and more flexible plate than glass. The first resin layer 410 may emit a point light source emitted from the light emitting device 200 in the form of a line light source or a surface light source.

The upper surface of the first resin layer 410 may emit light by diffusing light emitted from the light emitting device 200. For example, a bead (not shown) may be included in the first resin layer 410, and the bead diffuses and reflects incident light to increase the amount of light. The beads may be disposed in a range of 0.01 to 0.3% of the weight of the first resin layer 410. The bead may be composed of any one selected from silicon, silica, glass bubble, PMMA (Polymethyl methacrylate), urethane, Zn, Zr, $Al_2O_3$, and acrylic, The particle size of the beads may be in the range of 1 μm to 20 μm, but is not limited thereto.

The first resin layer 410 may have a thickness greater than that of the light emitting device 200. For example, the first resin layer 410 may have a thickness of 4 mm or less. In detail, the first resin layer 410 may have a thickness of 0.5 mm to 3 mm or less. In more detail, the first resin layer 410 may have a thickness of 1 mm to 3 mm. In more detail, the first resin layer 410 may have a thickness of 1.5 mm to 2.5 mm. When the thickness h1 of the first resin layer 410 is less than 0.5 mm, it may be difficult to effectively guide light to be emitted from the light emitting device 200. That is, since the distance between the light emitting devices 200 and the reflective layer 300 is too small, it may be difficult for the lighting devices 1000 to implement a surface light source. In addition, when the thickness h1 of the first resin layer 410 exceeds 4 mm, an overall light path may increase. Accordingly, light loss may occur during the process of emitting light emitted from the light emitting devices 200. Accordingly, it is preferable that the thickness h1 of the first resin layer 410 satisfies the aforementioned range. The first resin layer 410 may be disposed while surrounding the light emitting devices 200. The first resin layer 410 may seal the light emitting devices 200. The first resin layer 410 can protect the light emitting devices 200 and reduce loss of light emitted from the light emitting devices 200. The first resin layer 410 may contact the surface of the light emitting devices 200 and may contact the light emitting surface of each of the light emitting device 200. Also, the first resin layer 410 may contact the lower surface of the substrate 100 and the upper surface of the reflective layer 300. That is, the first resin layer 410 may support the substrate 100, the light emitting devices 200, and the reflective layer 300, and the components 100, 200, and 300 may be maintained at a set distance or at a set interval.

The second resin layer 420 may be disposed on the substrate 100. The second resin layer 420 may be disposed on an upper surface of the substrate 100 opposite to the lower surface of the substrate 100 on which the first resin layer 410 is disposed. The second resin layer 420 may be disposed on the entire upper surface or a partial region of the substrate 100. The second resin layer 420 may be formed of a transparent material. The second resin layer 420 may include a resin material such as silicone or epoxy. The second resin layer 420 may selectively include a thermosetting resin material, for example, PC, OPS, PMMA, or PVC. The second resin layer 420 may be made of glass, but is not limited thereto. For example, as a main material of the second resin layer 420, a resin material containing urethane acrylate oligomer as a main material may be used. For example, a mixture of a synthetic oligomer, urethane acrylate oligomer, and a polyacrylic polymer type may be used. Of course, it may further include a monomer mixed with low-boiling dilute reactive monomers such as IBOA (isobornyl acrylate), HPA (Hydroxylpropyl acrylate, 2-HEA (2-hydroxyethyl acrylate)), etc., and a photoinitiator (e.g., 1-hydroxy cyclohexyl phenyl-ketone, etc.) or an antioxidant, etc. The second resin layer 420 may include the same material as the first resin layer 410.

The second resin layer 420 may serve as a light guiding layer. For example, the second resin layer 420 may guide light incident through the substrate 100. In detail, the second resin layer 420 may further diffuse light that is reflected from the reflective layer 300 and has passed through the first resin layer 410 and the substrate 100. For example, a bead (not shown) may be included in the second resin layer 420, and the bead diffuses and reflects incident light to increase the amount of light. The beads may be disposed in a range of 0.01 to 0.3% of the weight of the second resin layer 420. The bead may be composed of any one selected from silicon, silica, glass bubble, PMMA (Polymethyl methacrylate), urethane, Zn, Zr, Al$_2$O$_3$, and acrylic, The particle size of the beads may be in the range of 1 μm to 20 μm, but is not limited thereto.

The second resin layer 420 may function as an adhesive layer. For example, the second resin layer 420 may be provided as an adhesive layer that bonds the substrate 100 disposed under the second resin layer 420 and two components disposed thereon. The second resin layer 420 may have a set thickness h2. For example, the thickness h2 of the second resin layer 420 may be 2 mm or less. In detail, the thickness h2 of the second resin layer 420 may be 50 μm to 1.5 mm. In more detail, the thickness h2 of the second resin layer 420 may be 100 μm to 1 mm. When the thickness h2 of the second resin layer 420 is less than 50 μm, it may be difficult to perform the function of an adhesive layer that bonds between the substrate 100 and components disposed thereon, and it may be difficult to effectively guide light incident on the second resin layer 420. That is, since the thickness h2 of the second resin layer 420 is relatively thin, a space for guiding light emitted through the substrate 100 may be insufficient. In addition, when the lighting device 1000 is bent in a third direction by an external force, for example, in a wave shape, the thickness h2 of the second resin layer 420 is too thin to effectively guide the light emitted through the substrate 100 and the first resin layer 410. When the thickness h2 of the second resin layer 420 exceeds 2 mm, the overall thickness of the lighting device 1000 increases, and thus the degree of freedom in design may decrease, and the light loss may occur due to the thickness h2 of the second resin layer 420. Therefore, it is preferable that the thickness h2 of the second resin layer 420 satisfies the aforementioned range.

The thickness h2 of the second resin layer 420 may be different from the thickness h1 of the first resin layer 410. In detail, the thickness h2 of the second resin layer 420 may be smaller than the thickness h1 of the first resin layer 410. For example, the thickness h2 of the second resin layer 420 may be 0.03% to 95% of the thickness h1 of the first resin layer 410. Accordingly, the lighting device 1000 according to the embodiment may emit light with excellent uniformity. That is, the lighting device 1000 may provide a line or surface light source having excellent uniformity as the first and second resin layers 410 and 420 satisfy the aforementioned thickness range.

The half mirror layer 610 may be disposed on the second resin layer 420. The half mirror layer 610 may be disposed on the entire or partial upper surface of the second resin layer 420. The half mirror layer 610 may be provided in a plane corresponding to the second resin layer 420. The half mirror layer 610 may include metal. For example, the half mirror layer 610 may be provided with at least one of various metals such as aluminum (Al), silver (Ag), copper (Cu), nickel (Ni), gold (Au), platinum (Pt), titanium (Ti), tungsten (W) in the form of a thin film. In addition, the half mirror layer 610 may include a substrate (not shown) and a metal layer (not shown). The substrate may include a material capable of transmitting light emitted from the light emitting device 200. For example, the substrate may be transparent. The metal layer may include at least one of various metals such as aluminum (Al), silver (Ag), copper (Cu), nickel (Ni), gold (Au), platinum (Pt), titanium (Ti), and tungsten (W). The metal layer may be formed on at least one of one surface and the other surface of the substrate through coating or deposition.

The half mirror layer 610 may have a set thickness. For example, the thickness h3 of the half mirror layer 610 may be 100 μm or less to provide a transflective function. In detail, the thickness h3 of the half mirror layer 610 may be 1 μm to 75 μm. In more detail, the thickness h3 of the half mirror layer 610 may be 1 μm to 50 μm. When the thickness h3 of the half mirror layer 610 is less than 1 μm, the transflective function of the half mirror layer 610 may deteriorate. In detail, since the thickness of the half mirror layer 610 is relatively thin, components disposed in the lower region of the half mirror layer 610 may be recognized from the outside (in the direction of the upper surface of the half mirror layer 610). In addition, when the thickness h3 of the half mirror layer 610 exceeds 100 μm, transmittance of light emitted from the light emitting device 200 may decrease. In detail, the light passing through the half mirror layer 610 may decrease due to the thickness of the half mirror layer 610, and thus the overall luminance of the lighting device 1000 may decrease. The thickness h3 of the half mirror layer 610 may be uniformly provided within the above range. In detail, the thickness h3 of the half mirror layer 610 in the vertical direction may be constant without changing along the horizontal direction (x-axis and y-axis directions). Alternatively, the thickness h3 of the half mirror layer 610 may vary. For example, the thickness h3 of the half mirror layer 610 may be provided so that a region vertically overlapping with the light emitting devices 200 is thicker than a non-overlapping region with the light emitting devices 200. In detail, in the half mirror layer 610, the thickness of a region where a hot spot of the light emitting devices 200 is formed may be thicker than that of a region where no hot spot is formed. For example, the half mirror layer 610 may have a concave-convex shape, and a cross section of the concave-convex shape may have a polygonal shape such as a semicircular shape, a triangle, or a polygon.

The half mirror layer 610 may provide a transflective function. The half mirror layer 610 may have a relatively low light transmittance and a relatively high reflectance for a color corresponding to the half mirror layer 610 among incident light. For example, the visible light wavelength band may include a first wavelength band defined as a partial wavelength band and a second wavelength band having a different wavelength band from the first wavelength band. In this case, the half mirror layer 610 may have a first color corresponding to the first wavelength band. In this case, the half mirror layer 610 may have a relatively low transmittance for light in the first wavelength band and a relatively high reflectance for light in the first wavelength band. That is, the reflectance of light in the first wavelength band of the half mirror layer 610 may be higher than the transmittance of light in the first wavelength band. Also, the half mirror layer 610 may have transmittance of light in the first wavelength band lower than transmittance of light in the second wavelength band. Accordingly, the lighting device 1000 according to the embodiment may have improved aesthetics due to the half mirror layer 610 having set light transmittance and reflectance. In detail, when the lighting device 1000 emits light, light emitted from the light emitting device 200 may be provided to the outside through the half mirror layer 610.

When the lighting device 1000 does not emit light, the first color, which is the color of the half mirror layer 610, is visually recognized from the outside, so that improved aesthetics may be obtained. For example, when the lighting device 1000 does not emit light, the half mirror layer 610 may be provided with the same or similar color as the color of a peripheral region of the lighting device 1000. Accordingly, the lighting device 1000 may have a hidden effect capable of preventing or minimizing external visibility. The half mirror layer 610 may effectively prevent a hot spot from occurring by forming a relatively thick thickness of a region corresponding to a hot spot formed by the light emitting devices 200. Accordingly, light emitted through the half mirror layer 610 may have uniform luminance, and the lighting device 1000 may provide a linear light source or a surface light source having improved light characteristics.

The optical member 630 may be disposed on the second resin layer 420. The optical member 630 may be disposed between the second resin layer 420 and the half mirror layer 610. The optical member 630 may prevent or minimize a change in color of light emitted from the lighting device 1000 from color of light emitted from the light emitting devices 200. In detail, the optical member 630 may compensate for the light spectrum changed by the half mirror layer 610. The optical member 630 may include a material capable of controlling transmittance and reflectance of light in a set wavelength band. For example, the optical member 630 may include a material such as metal, resin, or ceramic, and may be provided in the form of a film or a prism sheet.

The optical member 630 may have a set thickness. For example, the thickness h4 of the optical member 630 may be 300 μm or less. In detail, the thickness h4 of the optical member 630 may be 1 μm to 300 μm. In more detail, the thickness h4 of the optical member 630 may be 1 μm to 250 μm.

When the thickness h4 of the optical member 630 is less than 1 μm, the optical spectrum compensation effect may be insignificant. In detail, since the thickness h4 of the optical member 630 is relatively thin, the optical spectrum compensation effect by the half mirror layer 610 may be insignificant. Accordingly, the color of light emitted to the outside of the lighting device 1000 may not correspond to the color of light emitted from the light emitting device 200. When the thickness h4 of the optical member 630 exceeds 300 μm, transmittance of light emitted from the light emitting device 200 may decrease. In detail, since the thickness of the optical member 630 is relatively thick, the light passing through the optical member 630 may decrease, and thus the overall luminance of the lighting device 1000 may decrease. In addition, since the thickness h4 of the optical member 630 is too thick, the optical spectrum compensation effect may deteriorate. Accordingly, the color of light emitted to the outside of the lighting device 1000 may not correspond to the color of light emitted from the light emitting device 200. Preferably, when the optical member 630 is provided as a thin film in the form of a film, the optical member 630 may have a thickness h4 of 1 μm to 150 μm, and when provided in the form of a prism sheet, the optical member 630 may have a thickness h4 of 1 μm to 150 μm. The thickness h4 of the member 630 may be 50 μm to 250 μm.

The optical member 630 may provide an optical spectrum compensation effect by the half mirror layer 610. For example, since the half mirror layer 610 is provided in the first color, transmittance of light in the first wavelength band may be lower than transmittance of light in the second wavelength band. In this case, the optical member 630 may be provided such that the transmittance of light in the first wavelength band is higher than the transmittance of light in the second wavelength band. Accordingly, while the light emitted from the light emitting device 200 passes through each of the optical member 630 and the half mirror layer 610, the light spectrum may be compensated due to a difference in light transmittance according to the wavelength bands. Accordingly, the light emitted to the outside of the lighting device 1000 may have a color corresponding to that of the light emitting device 200, for example, a color identical to or similar to that of light emitted from the light emitting device 200.

For example, the embodiment may include a plurality of light emitting devices 200, and each of the plurality of light emitting devices 200 may emit light of the same color as each other, for example, white light. In addition, the half mirror layer 610 may be provided in a first color, for example, red, and has a relatively low transmittance for light in a first wavelength band corresponding to the first color, and has a relatively high transmittance in the second wavelength band. Accordingly, when white light emitted from the light emitting devices 200 passes through the half mirror layer 610, the color of the passed light may be similar to cyan rather than white. The optical member 630 located in the light emission path of the light emitting devices 200 has a relatively high transmittance for the light of the first wavelength band, and may have a relatively low light transmittance of a wavelength corresponding to the light of the second wavelength band, for example, green and blue. That is, the transmittance of the red light of the optical member 630 may be higher than the transmittance of the green and blue light. Accordingly, the light spectrum may be compensated by the difference in transmittance according to the wavelength band of each layer 610 and 630 by passing the light emitted from the light emitting devices 200 through the optical member 630 and the half mirror layer 610, respectively. Therefore, when white light is emitted from the light emitting devices 200, the light emitted to the outside of the lighting device 1000 may have the same or similar color as the white light emitted from the light emitting devices 200.

The optical member 630 may be provided as a single layer or multiple layers. For example, when the optical member 630 is provided in one layer, the one layer may compensate for light in a wavelength band having relatively low transmittance in the half mirror layer 610, and may reduce the transmittance of light in a wavelength band with a relatively high transmittance in the half mirror layer 610. Accordingly, the optical member 630 may compensate for the light spectrum changed by the half mirror layer 610. As another example, the optical member 630 may be provided in multiple layers. For example, the optical member 630 may include a first optical layer 631 and a second optical layer 632. The first optical layer 631 may be disposed between the second resin layer 420 and the half mirror layer 610. The second optical layer 632 may be disposed between the first optical layer 631 and the half mirror layer 610.

Each of the first optical layer 631 and the second optical layer 632 may have a set thickness. For example, the thickness h5 of the first optical layer 631 and the thickness h6 of the second optical layer 632 may be 150 μm or less. In detail, the thickness h5 of the first optical layer 631 and the thickness h6 of the second optical layer 632 may be 0.5 μm to 125 μm. In more detail, the thickness h5 of the first optical layer 631 and the thickness h6 of the second optical layer 632 may be 0.5 μm to 100 μm. Preferably, the thickness h5 of the first optical layer 631 and the thickness h6 of the second optical layer 632 may be 0.5 μm to 75 μm for optical efficiency and luminous intensity compensation.

The first optical layer 631 and the second optical layer 632 may compensate for light in a wavelength band having relatively low transmittance in the half mirror layer 610. For example, the second wavelength band of the visible light wavelength band may include a second-first wavelength band and a second-second wavelength band different from the second-first wavelength band. The first optical layer 631 may have relatively high transmittance to light in the first wavelength band and the second-first wavelength band, and may have relatively low transmittance to light in the second-second wavelength band. In this case, transmittance of the first optical layer 631 to light in the first and second-first wavelength bands may be higher than transmittance to light in the second-second wavelength band. The second optical layer 632 may have relatively high transmittance to light in the first wavelength band and the second-second wavelength band, and may have relatively low transmittance to light in the second-first wavelength band. In this case, transmittance of the second optical layer 632 to light in the first and second-second wavelength bands may be higher than transmittance to light in the second-first wavelength band.

The first and second optical layers 631 and 632 may compensate for the light spectrum changed by the half mirror layer 610 in advance. For example, each of the plurality of light emitting devices 200 may emit white light, and the first optical layer 631 may be provided with the first color, for example, red. In this case, the first optical layer 631 may have a relatively high transmittance for light in the first and second-first wavelength bands, and may have a low transmittance for light in the second-second wavelength band. For example, the first optical layer 631 may have relatively high transmittance of light in a wavelength band corresponding to red and green, and may have relatively low transmittance of light in a wavelength band corresponding to blue.

The second optical layer 632 may have relatively high transmittance to light in the first and second-second wavelength bands, and may have low transmittance to light in the second-first wavelength band. For example, the second optical layer 632 may have a relatively high transmittance of light in a wavelength band corresponding to red and blue, and may have a relatively low transmittance of light in a wavelength band corresponding to green. Accordingly, the light L emitted from the light emitting device 200 may be compensated by a difference in transmittance according to the wavelength band of each layer 631, 632, and 610 in the process of passing through the first and second optical layers 631, 632, and 610, respectively. Therefore, when white light L is emitted from the light emitting devices 200, the light L emitted to the outside of the lighting device 1000 may have the same or similar color as the white light L emitted from the light emitting devices 200.

The lighting device 1000 may further include a protective layer 500. The protective layer 500 may be disposed on the substrate 100. The protective layer 500 may be disposed on the second resin layer 420. The protective layer 500 may be disposed on the half mirror layer 610. The protective layer 500 may be disposed on the outermost side of the lighting device 1000. The protective layer 500 may include a light-transmitting material. In detail, the protective layer 500 may include a material through which light passing through the upper and lower surfaces is transmitted. That is, the protective layer 500 may be a light transmission layer. For example, the protective layer 500 may include at least one of polyethylene terephthalate (PET), polystyrene (PS), polyimide (PI), polyethylene naphthalate (PEN), and polycarbonate (PC). The protective layer 500 may have a set thickness and protect components disposed below, such as the substrate 100, the first resin layer 410, the optical member 630, and the half mirror layer 610. For example, the protective layer 500 may have a thickness of 100 μm or more, for example, 100 μm to 2.5 mm. In detail, the protective layer 500 may have a thickness of 200 μm to 2 mm. In more detail, the protective layer 500 may have a thickness of 1 mm to 2 mm. When the thickness of the protective layer 500 is less than 100 μm, it may be difficult to effectively protect the components disposed thereunder due to the relatively thin thickness. Also, when the thickness of the protective layer 500 exceeds 2.5 mm, the total thickness of the lighting device 1000 may increase and luminance may decrease. In addition, when the thickness of the protective layer 500 exceeds 2.5 mm, flexibility of the lighting device 1000 may be reduced due to the thickness. In this case, the structure and form to which the lighting device 1000 may be applied may be limited. Therefore, it is preferable that the thickness of the protective layer 500 satisfies the aforementioned range.

Figure 5:
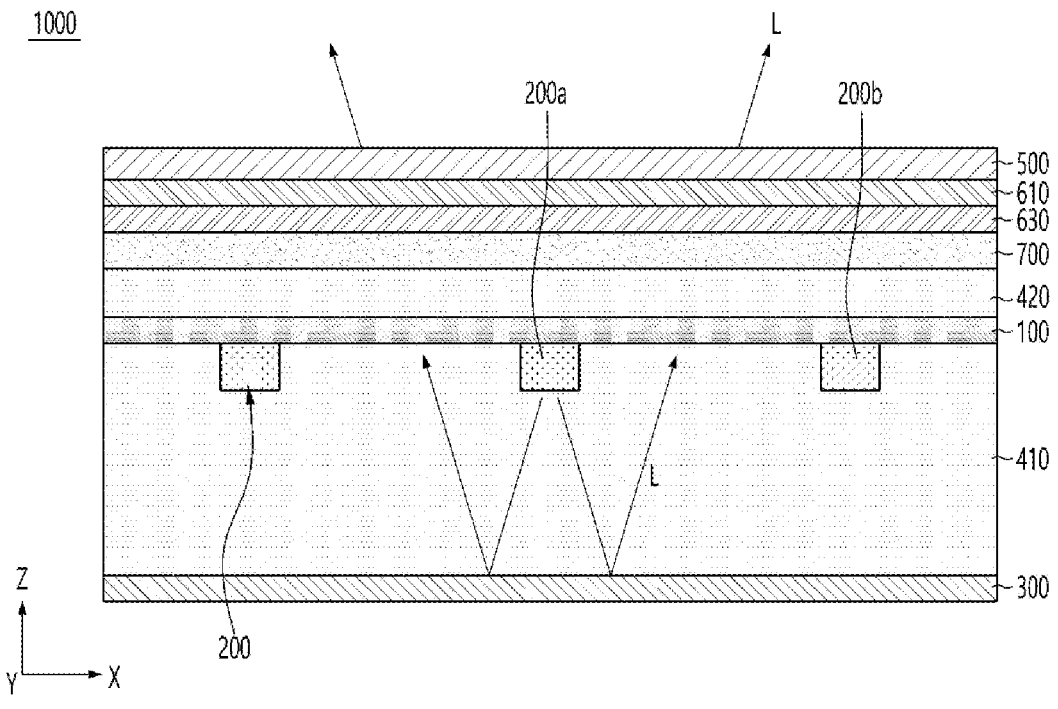
FIG. 5 is a cross-sectional view in which a light blocking layer is added to a lighting device according to the embodiment.
Figure 6:
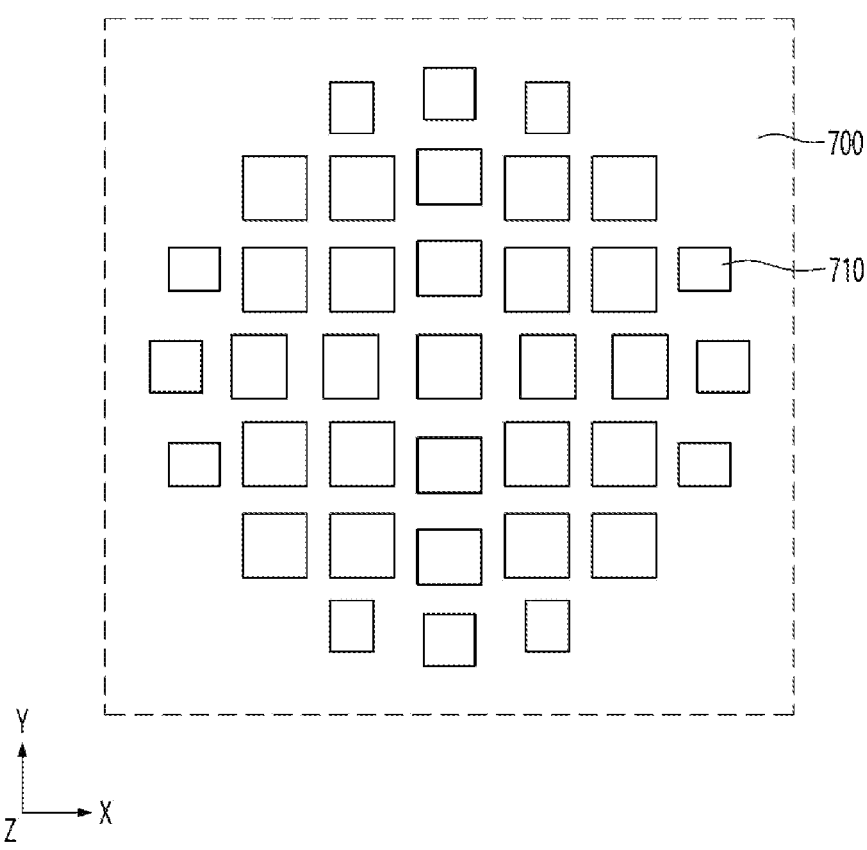
FIG. 6 is a plan view of the light blocking layer according to the embodiment.

FIG. 5 is a cross-sectional view in which a light blocking layer is added to a lighting device according to an embodiment, and FIG. 6 is a plan view of the light blocking layer according to an embodiment. In the description using FIGS. 5 and 6, the same reference numerals are given to the same and similar components as those of the above-described lighting device and the same or similar configurations are omitted.

Referring to FIGS. 5 and 6, the lighting device 1000 according to the embodiment may include a light blocking layer 700. The light blocking layer 700 may be disposed on the upper surface of the substrate 100. The light blocking layer 700 may be disposed on the second resin layer 420. The light blocking layer 700 may be disposed between the second resin layer 420 and the protective layer 500.

The light blocking layer 700 may include a light-transmitting material. For example, the light blocking layer 700 may include at least one of polyethylene terephthalate (PET), polystyrene (PS), polyimide (PI), polyethylene naphthalate (PEN), and polycarbonate (PC). A region of the light blocking layer 700 other than the light blocking pattern 710 to be described below is formed may be a light transmission layer. The light blocking layer 700 may have a set thickness. For example, the light blocking layer 700 may have a thickness of 50 μm to 300 μm. In detail, the light blocking layer 700 may have a thickness of 80 μm to 250 μm. In more detail, the light blocking layer 700 may have a thickness of 100 μm to 200 μm. When the thickness of the light blocking layer 700 is less than 50 μm, it may be difficult to effectively block light incident from a lower portion of the light blocking layer 700. That is, a hot spot may be formed because the light blocking layer 700 does not have a sufficient thickness for hot spot control. In addition, when the thickness of the light blocking layer 700 exceeds 300 μm, the formation of hot spots by light emitted from the light emitting device 200 may be effectively controlled, but the light emitted from the light emitting device 200 may be lost while passing through the light blocking layer 700, and thus overall luminance may decrease. Therefore, it is preferable that the thickness of the light blocking layer 700 satisfies the aforementioned range.

The light blocking layer 700 may include a plurality of light blocking patterns 710 spaced apart from each other in the first and second directions. The plurality of light blocking patterns 710 may be formed on at least one of a lower surface facing the second resin layer 420 and an upper surface facing the protective layer 500. The light blocking patterns 710 may block light emitted through the substrate 100. The light blocking patterns 710 may include ink. For example, the light blocking patterns 710 may be printed with a material including any one of TiO$_2$, CaCO$_3$, BaSO$_4$, Al$_2$O$_3$, Silicon, and PS. The light blocking patterns 710 may be white with excellent reflective properties. In addition, the light blocking patterns 710 may be provided in a concave groove shape on at least one of the upper and lower surfaces of the light blocking layer 700. For example, when the light blocking patterns 710 is formed on the upper surface of the light blocking layer 700, the light blocking patterns 710 may be provided in the form of a concave groove from the upper surface to the lower surface of the light blocking layer 700.

The plurality of light blocking patterns 710 may be disposed in a region corresponding to the light emitting devices 200. In detail, a portion of the light blocking patterns 710 may be disposed in a region overlapping the light emitting device 200 in a vertical direction. Densities of the plurality of light blocking patterns 710 may change as the distance from the region corresponding to the light emitting device 200 increases. For example, the density of the plurality of light blocking patterns 710 may decrease as the distance from the region overlapping the optical axis of the light emitting device 200 in the light blocking layer 700 increases. In addition, the size of each of the plurality of light blocking patterns 710 may decrease as the distance from the region overlapping the optical axis of the light emitting device 200 decreases or may have the same size as each other. The plurality of light blocking patterns 710 may have a set shape. For example, when viewing the light blocking patterns 710 from the top, the light blocking pattern 710 may have various shapes such as a polygonal shape, a circular shape, and an elliptical shape. In addition, the light blocking region formed by the plurality of light blocking patterns 710 may have a shape close to a circle as shown in FIG. 6. A light blocking region formed by the plurality of light blocking patterns 710 may have a set area. For example, an area of the light blocking region may be greater than an area of the lower surface of the light emitting devices 200. For example, the area of the light blocking region may be 5 times or more, for example, 5 to 20 times the area of the lower surface of the light emitting devices 200. In detail, the area of the light blocking region may be 8 to 15 times the area of the lower surface of the light emitting devices 200.

When the area of the light blocking region formed by the plurality of light blocking patterns 710 is less than 5 times the area of the lower surface of the light emitting device 200, it is difficult to prevent hot spots from being formed by light passing through the substrate 100. In addition, when the area of the light blocking region exceeds 20 times the area of the lower surface of the light emitting device 200, the light passing through the substrate 100 may prevent hot spots from being formed, but the overall luminance of the lighting device 1000 may be reduced by the light blocking patterns 710. Accordingly, it is preferable that the light blocking region formed by the plurality of light blocking patterns 710 satisfy the aforementioned range.

Figure 7:
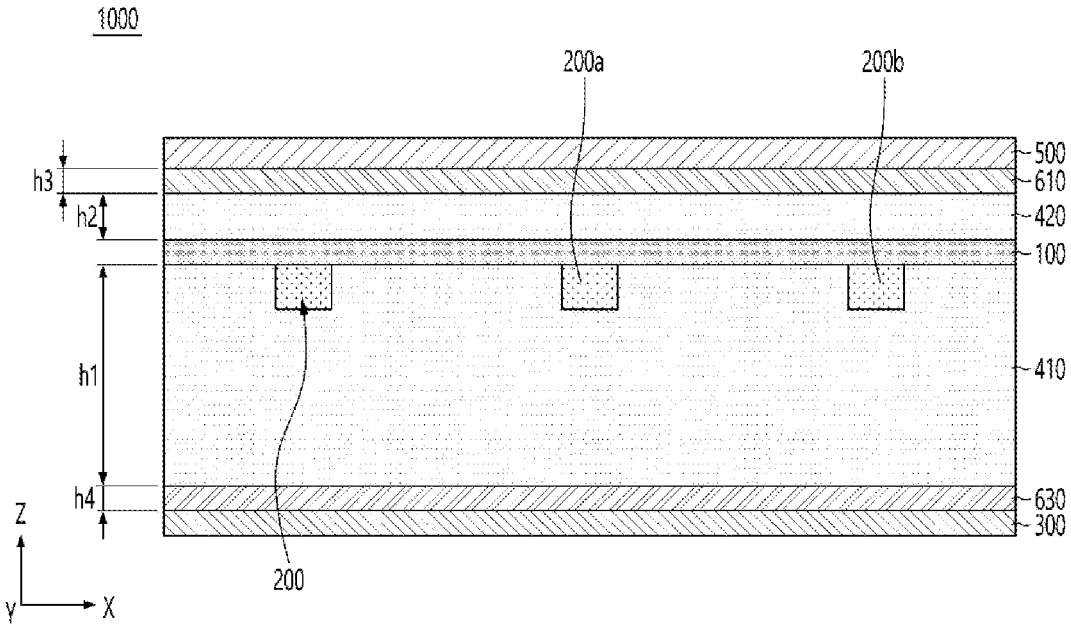
FIGS. 7 to 9 are other cross-sectional views of a lighting device according to the embodiment.
Figure 8:
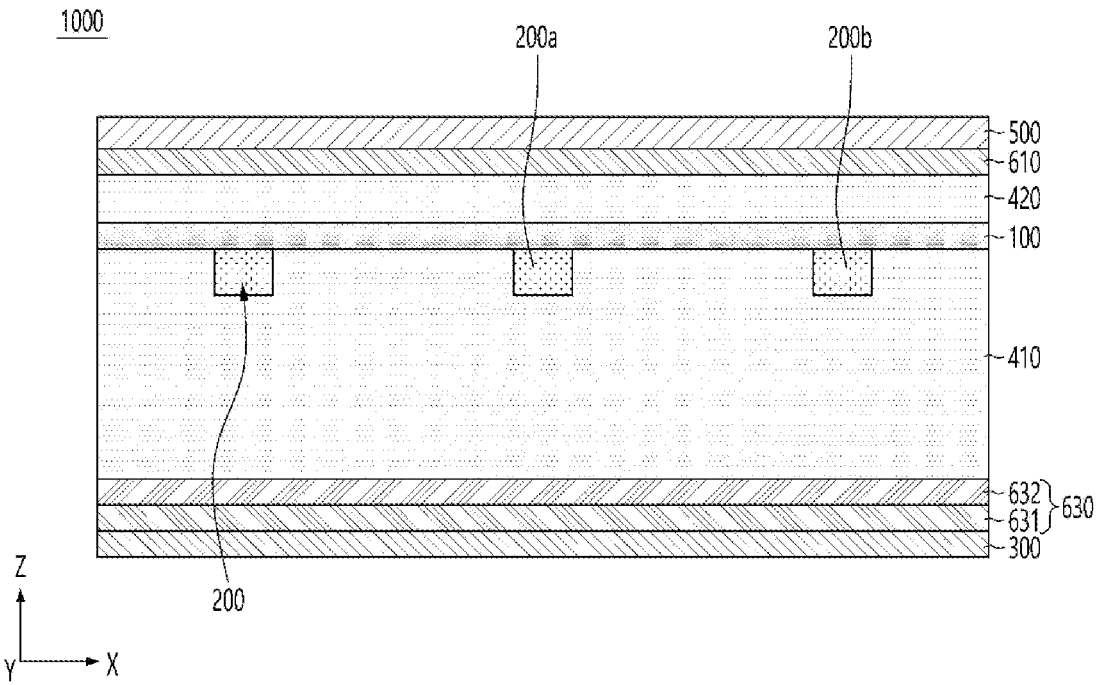
Figure 9:
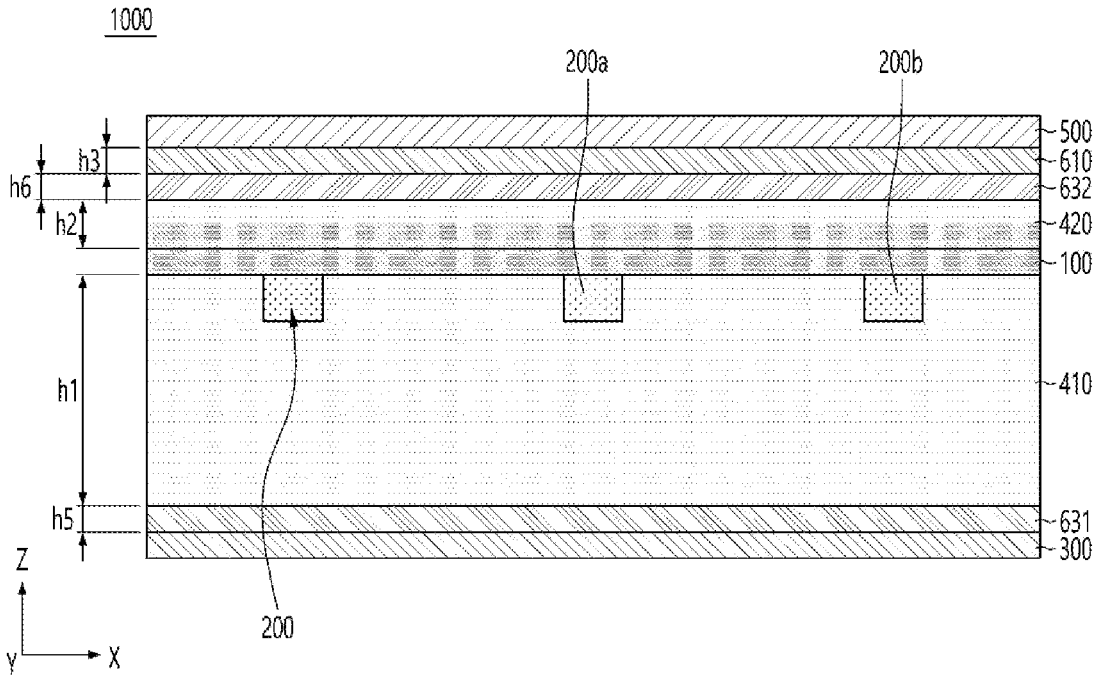

FIGS. 7 to 9 are other cross-sectional views of a lighting device according to an embodiment. In the description using FIGS. 7 to 9, descriptions of components identical to or similar to those of the lighting device described above are omitted, and identical reference numerals are given to components similar to those of the lighting device described above.

Referring to FIG. 7, the optical member 630 may be disposed under the first resin layer 410. The optical member 630 may be disposed between the reflective layer 300 and the first resin layer 410. Light emitted through the light emitting surface of the light emitting device 200 may be reflected by the reflective layer 300 and pass through the substrate 100, and may pass through the optical member 630 in this process. In detail, the light emitted from the light emitting device 200 may pass through the optical member 630 and be provided to the reflective layer 300, and after being reflected by the reflective layer 300, and it may pass through the optical member 630 again and through the substrate 100. The optical member 630 may have a set thickness. For example, the thickness h4 of the optical member 630 may be 300 μm or less. In detail, the thickness h4 of the optical member 630 may be 1 μm or more, for example, 1 μm to 300 μm. In more detail, the thickness h4 of the optical member 630 may be 1 μm to 250 μm.

The optical member 630 may prevent or minimize a change in color of light emitted from the lighting device 1000 from color of light emitted from the light emitting device 200. In detail, the optical member 630 may compensate for the light spectrum changed by the half mirror layer 610 in advance. For example, the half mirror layer 610 may be provided with red, which is defined as the first color, and the light emitting device 200 may emit white light. In this case, the optical member 630 may be provided so that transmittance of light in the first wavelength band (red) is higher than transmittance of light in the second wavelength band (green or blue). Accordingly, the light L emitted from the light emitting device 200 may have a color close to red while passing through the optical member 630. Thereafter, the light may pass through the half mirror layer 610 having a relatively low transmittance for light in the first wavelength band. Accordingly, the light L emitted to the outside of the lighting device 1000 may have the same or similar color as the light emitted from the light emitting device 200.

Referring to FIGS. 8 and 9, the optical member 630 may be provided in multiple layers. The optical member 630 may include a first optical layer 631 and a second optical layer 632. First, referring to FIG. 8, the first optical layer 631 may be disposed between the reflective layer 300 and the first resin layer 410, and the second optical layer 632 may be disposed between the first optical layer 631 and the first resin layer 410. Alternatively, referring to FIG. 9, the first optical layer 631 may be disposed between the reflective layer 300 and the first resin layer 410, and the second optical layer 632 may be disposed between the second resin layer 420 and the half mirror layer 610.

Each of the first optical layer 631 and the second optical layer 632 may have a set thickness. For example, the thickness h5 of the first optical layer 631 and the thickness h6 of the second optical layer 632 may be 150 μm or less. In detail, the thickness h5 of the first optical layer 631 and the thickness h6 of the second optical layer 632 may be 0.5 μm to 125 μm. In more detail, the thickness h5 of the first optical layer 631 and the thickness h6 of the second optical layer 632 may be 0.5 μm to 100 μm. Preferably, the thickness h5 of the first optical layer 631 and the thickness h6 of the second optical layer 632 may be 0.5 μm to 75 μm for optical efficiency and optical spectrum compensation. The first optical layer 631 and the second optical layer 632 may compensate for light in a wavelength band having relatively low transmittance in the half mirror layer 610. For example, the first optical layer 631 may have relatively high transmittance to light in the first and second-first wavelength bands, and may have relatively low transmittance to light in the second-second wavelength band. In addition, the second optical layer 632 may have relatively high transmittance to light in the first and second-second wavelength bands, and may have relatively low transmittance to light in the second-first wavelength band.

The first and second optical layers 631 and 632 may compensate for the light spectrum changed by the half mirror layer 610 in advance. For example, the half mirror layer 610 may be provided with red, which is defined as the first color, and the light emitting device 200 may emit white light. In this case, the first optical layer 631 may have a high transmittance to light in the first and second-first wavelength bands (red and green), and may have a low transmittance to light in the second-second wavelength band (blue). In addition, the second optical layer 632 may have a high transmittance to light in the first and second-second wavelength bands (red and blue), and may have a low transmittance to light in the second-first wavelength band (green). Accordingly, the light L emitted from the light emitting device 200 may have a color close to red while passing through the first optical layer 631 and the second optical layer 632. Thereafter, the light may pass through the half mirror layer 610 having a relatively low transmittance for light in the first wavelength band. Accordingly, the light L emitted to the outside of the lighting device 1000 may have the same or similar color as the light emitted from the light emitting device 200.

Figure 10:
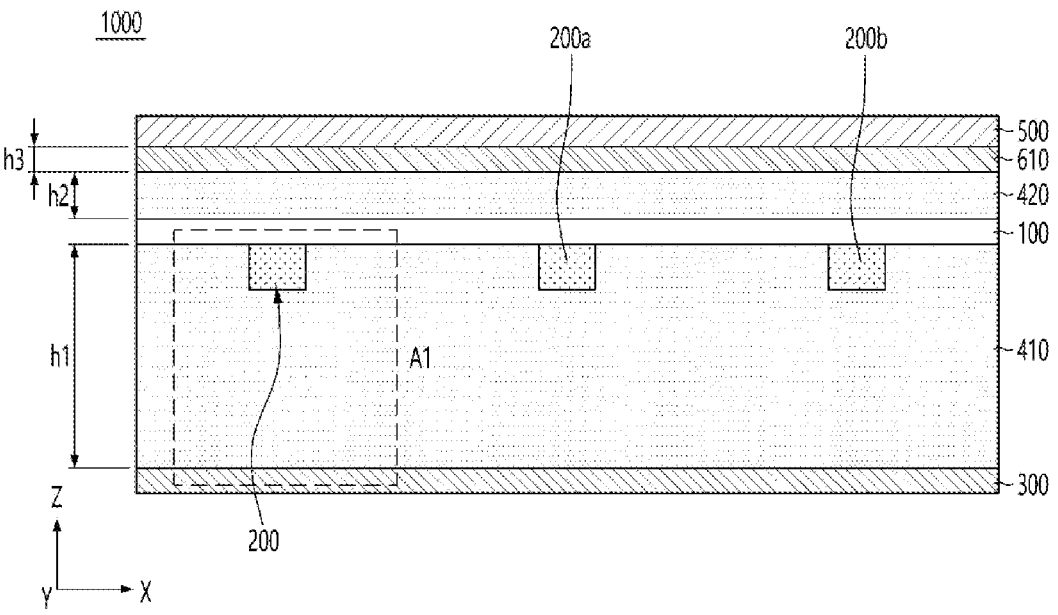
FIG. 10 is a cross-sectional view of a lighting device according to a comparative example.
Figure 11:
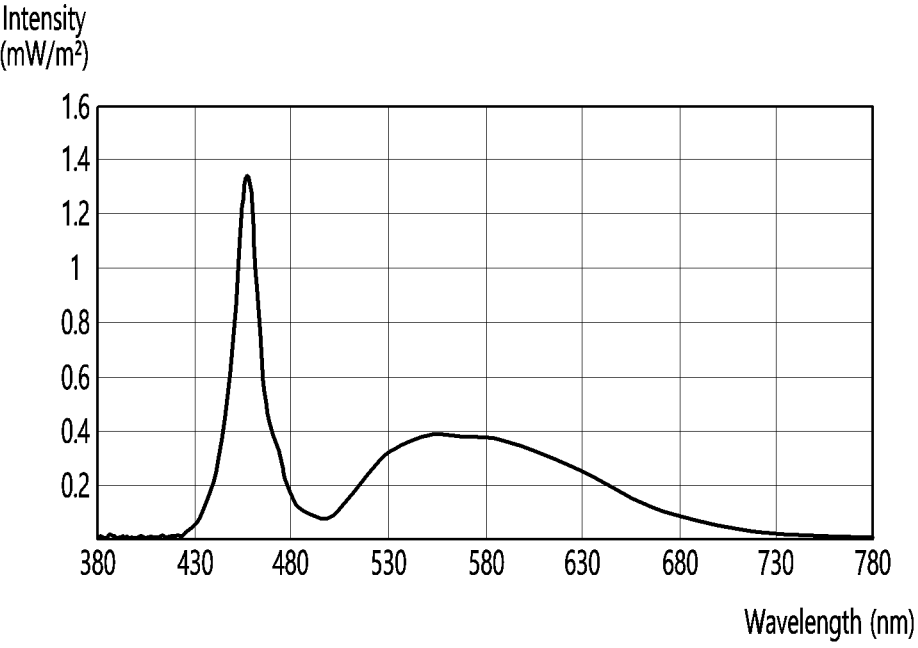
FIGS. 11 and 12 are diagrams for explaining light spectrum of a lighting device according to the comparative example.
Figure 12:
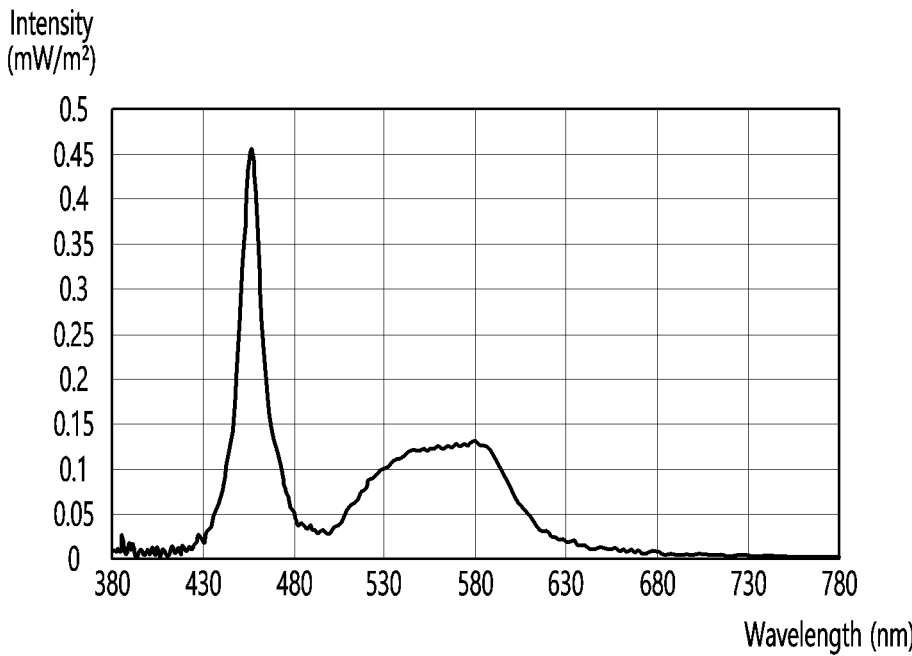
Figure 13:
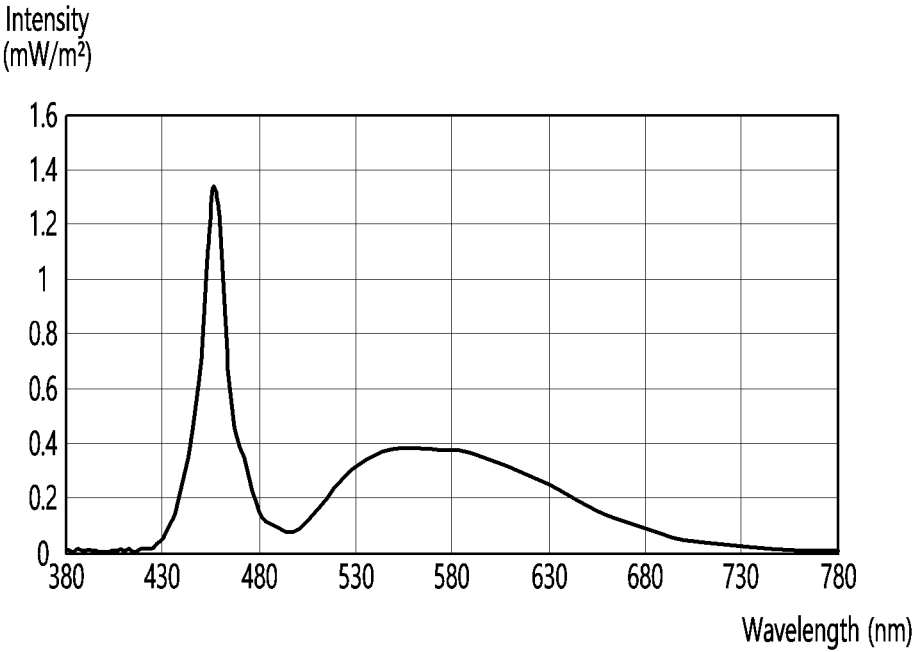
FIGS. 13 to 15 are diagrams for explaining the light spectrum of the lighting device according to FIG. 1.
Figure 14:
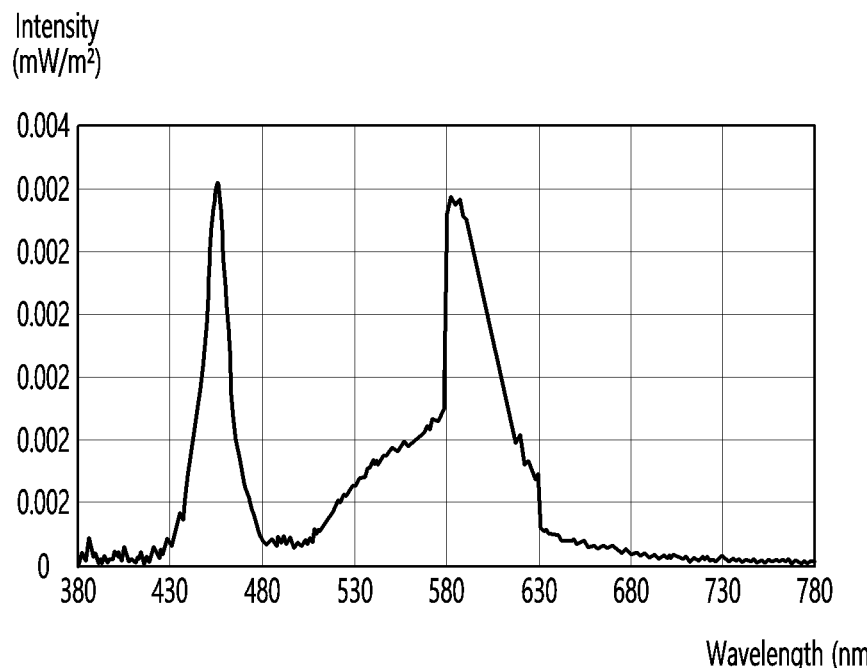
Figure 15:
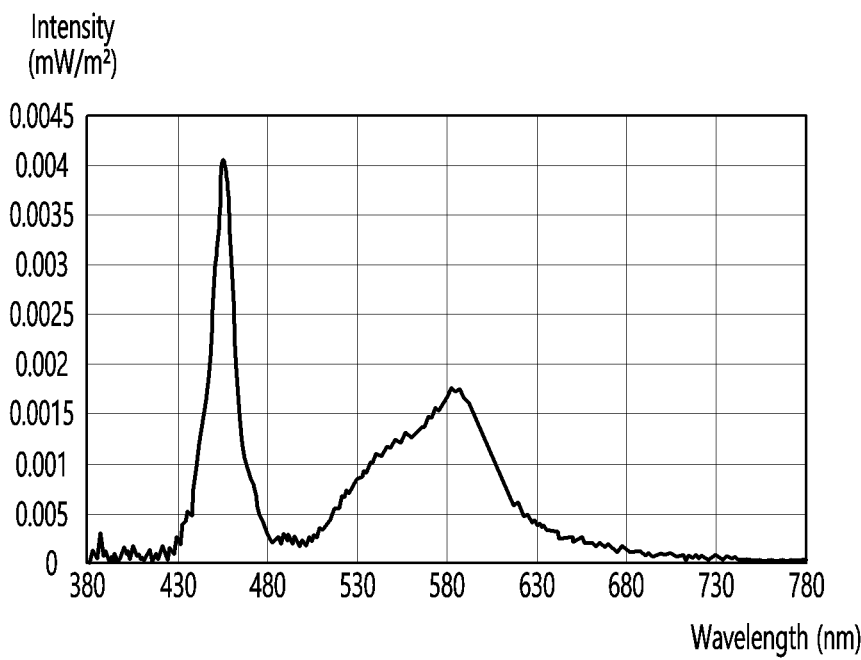

FIG. 10 is a cross-sectional view of a lighting device according to a comparative example, and FIGS. 11 and 12 are diagrams for explaining a light spectrum of the lighting device according to a comparative example. Also, FIGS. 13 to 15 are diagrams for explaining the light spectrum according to the wavelength of the lighting device according to FIG. 1.

The functions and effects of the invention will be described in more detail through comparative examples and the embodiment below.

Comparative Example

A lighting device was manufactured in which a reflective layer 300, a first resin layer 410 disposed on the reflective layer 300, a substrate 100 disposed on the first resin layer 410, a light emitting device 200 disposed between the first resin layer 410 and the substrate 100, a second resin layer 420 disposed on the substrate 100, and a half mirror layer 610 disposed on second resin layer 420 are disposed. The light emitting device 200 emits white light, and the light emitting surface of the light emitting device 200 is disposed to face the upper surface of the reflective layer 300. In addition, the half mirror layer 610 is provided in red, so that the light emitting device 200 is visible in red when it does not emit light.

Embodiment

Compared to the lighting device according to the comparative example, an optical member 630 was further disposed between the second resin layer 420 and the half mirror layer 610 to manufacture the lighting device. At this time, the light emitting device 200 emits white light, and the light emitting surface of the light emitting device 200 is disposed to face the upper surface of the reflective layer 300. In addition, the half mirror layer 610 is provided in red, so that the light emitting device 200 is visible in red when it does not emit light.

Referring to FIGS. 10 to 12, in the lighting device 1000 according to the comparative example, the light emitting device 200 may emit white light. In detail, the light emitting device 200 may emit white light through a light emitting surface, and the light may be reflected by the reflective layer 300 and pass through the substrate 100. Then, the light may pass through the half mirror layer 610. When the lighting device 1000 according to the comparative example does not include the half mirror layer 610, light emitted from the lighting device 1000 may have a light spectrum as shown in FIG. 11 and may have a white color. In addition, when the lighting device 1000 according to the comparative example includes the half mirror layer 610 having the first color, for example, red, the half mirror layer 610 may have a reduced transmittance with respect to light in a wavelength band corresponding to the first color. That is, the half mirror layer 610 may have low transmittance for light in a wavelength band corresponding to red. Accordingly, the light passing through the half mirror layer 610 and emitted from the lighting device 1000 may have an optical spectrum as shown in FIG. 12 and may have a color similar to cyan. That is, in the lighting device 1000 according to the comparative example, the light emitted from the light emitting device 200 and the light emitted to the outside of the lighting device 1000 may have different colors.

However, in the lighting device 1000 according to the embodiment, the light emitted from the light emitting device 200 and the light emitted to the outside of the lighting device 1000 may have the same or similar color.

Referring to FIGS. 13 to 15, in the lighting device 1000 according to the embodiment, the light emitting device 200 may emit white light. In detail, the light emitting device 200 may emit white light through a light emitting surface, and the light may be reflected by the reflective layer 300 and pass through the substrate 100. Then, the light may pass through the optical member 630 and the half mirror layer 610. When the lighting device 1000 according to the embodiment does not include the optical member 630 and the half mirror layer 610, the light emitted from the lighting device 1000 may have a light spectrum as shown in FIG. 13 and may have white. In addition, when the lighting device 1000 according to the embodiment includes the optical member 630, the light emitted from the lighting device 1000 may have a light spectrum as shown in FIG. 14 and may have a white color containing a small amount of red. In addition, when the lighting device 1000 according to the embodiment includes the optical member 630 and the half mirror layer 610, the light emitted from the lighting device 1000 may have a light spectrum as shown in FIG. 15 and may have white. That is, in the lighting device 1000 according to the embodiment, the light emitted from the light emitting device 200 and the light emitted to the outside of the lighting device 1000 may be the same or similar to each other. Accordingly, the lighting device 1000 according to the embodiment may have improved aesthetics. In detail, when the lighting device 1000 is turned on, light of the same color as the light emitted from the light emitting device 200 may be emitted outside the lighting device 1000 by the optical member 630 and the half mirror layer 610. In addition, when the lighting device 1000 is turned off, the inside of the above lighting device 1000 is not visible from the outside of the lighting device 1000, and the color of the half mirror layer 610 may be visible. Accordingly, the lighting device 1000 may have improved aesthetics.

Figure 16:
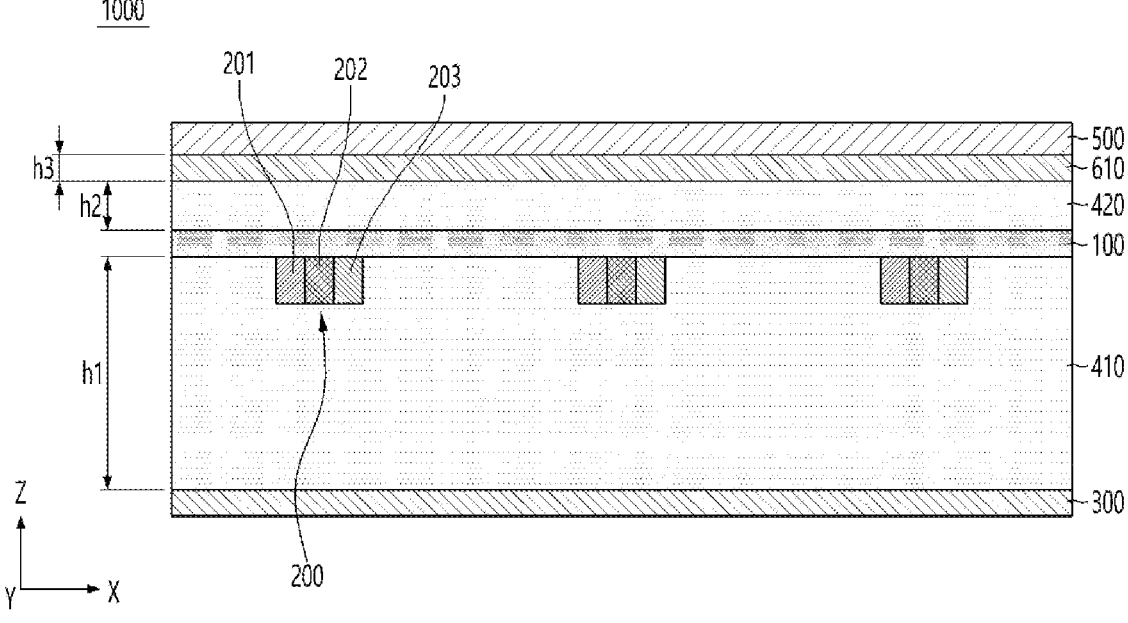
FIG. 16 is another cross-sectional view of the lighting device according to the embodiment.
Figure 17:
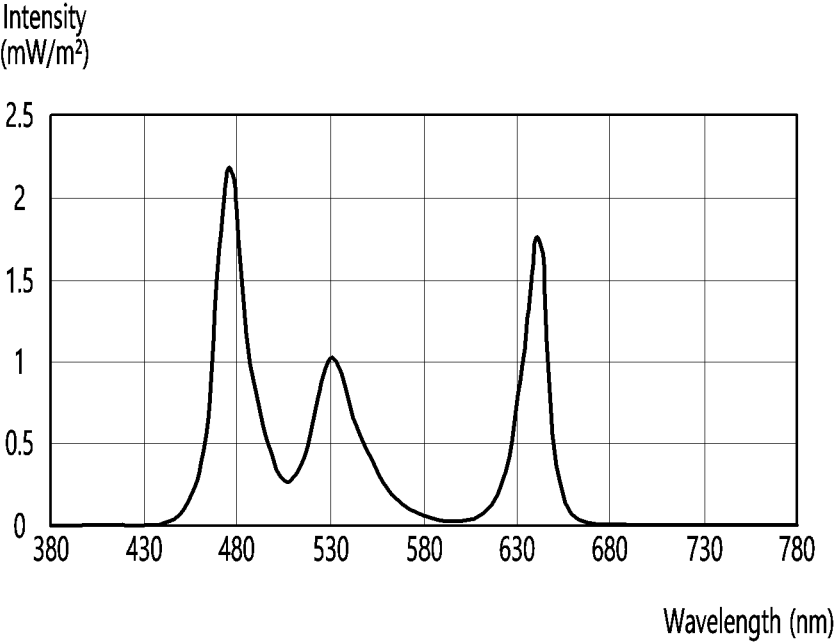
FIGS. 17 to 19 are views for explaining the light spectrum of the lighting device according to FIG. 16.
Figure 18:
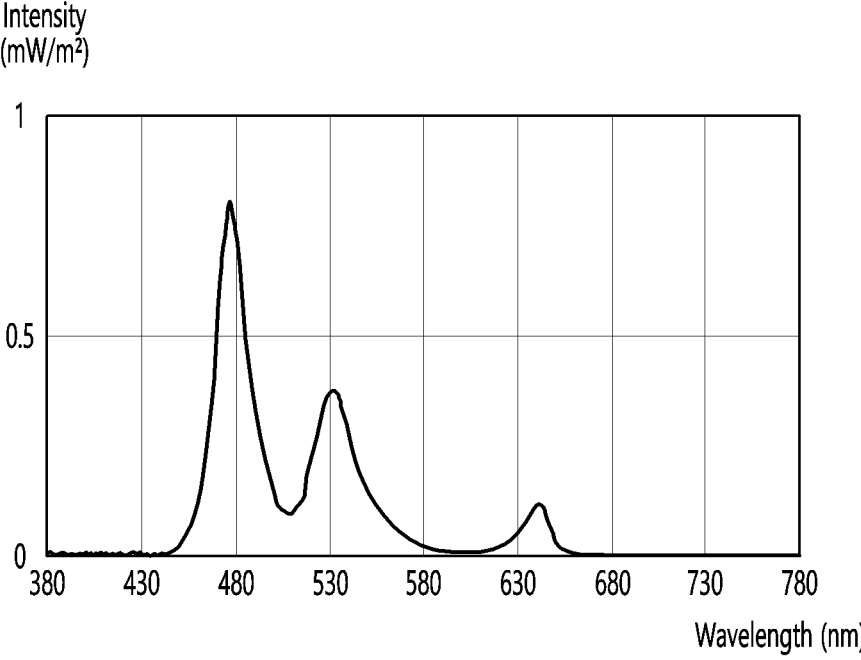
Figure 19:
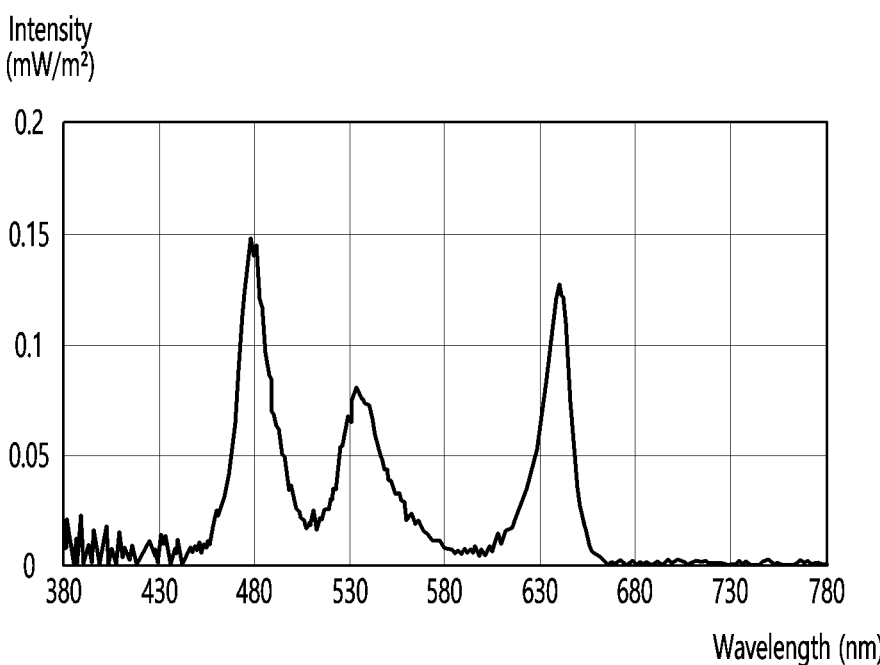

FIG. 16 is another cross-sectional view of a lighting device according to an embodiment, and FIGS. 17 to 19 are diagrams for explaining a light spectrum of the lighting device according to FIG. 16. In the description using FIGS. 16 to 19, the same reference numerals are given to the same and similar components as the above-described lighting device and the same or similar configurations are omitted.

Referring to FIGS. 16 to 19, the lighting device 1000 according to the embodiment may include a substrate 100, a light emitting device 200, a reflective layer 300, a first resin layer 410, and a second resin layer 420, and a half mirror layer 610. In the lighting device 1000 according to FIG. 16, the optical member 630 may be omitted compared to the lighting device 1000 described above. The light emitting device 200 may be disposed on the substrate 100, and a light emitting surface may be disposed facing the reflective layer 300. Accordingly, light emitted through the light emitting surface of the light emitting device 200 may be reflected by the reflective layer 300 and pass through the substrate 100. Then, the light may pass through the half mirror layer 610 and be emitted to the outside of the lighting device 1000. A plurality of light emitting devices 200 may be disposed on the substrate 100. In detail, the light emitting device 200 may include a first light emitting device 201, a second light emitting device 202, and a third light emitting device 203 disposed adjacent to each other. The first to third light emitting devices 201, 202, and 203 may form one unit light emitting group. A plurality of unit light emitting groups may be disposed on the substrate 100. For example, a plurality of unit light emitting groups spaced apart from each other in a first direction (x-axis direction) and/or a second direction (y-axis direction) may be included on the substrate.

Each of the first to third light emitting devices 201, 202, and 203 may emit light of a set color. In detail, the first light emitting device 201 may emit red light, the second light emitting device 202 may emit green light, and the third light emitting device 203 may emit blue light. Accordingly, the unit light emitting group may emit light of various colors. For example, the unit light emitting group may control the light intensity of the first to third light emitting devices 201, 202, and 203 to control the color of light passing through the half mirror layer 610 to white light. In detail, when the lighting device 1000 does not include the half mirror layer 610, light emitted from the lighting device 1000 may have a light spectrum as shown in FIG. 17 and may have a white color. In addition, when the lighting device 1000 includes the half mirror layer 610, the light emitted from the lighting device 1000 may have a light spectrum as shown in FIG. 18 and may have a color similar to cyan. However, the lighting device 1000 may compensate for the light spectrum changed by the half mirror layer 610. In detail, the lighting device 1000 may compensate for the light spectrum by controlling the light intensity of the light emitting device 200. For example, the half mirror layer 610 may be provided in a first color, for example, red. That is, the half mirror layer 610 has a relatively low transmittance for light of the first wavelength band corresponding to the first color and may have a relatively high transmittance to light in the second wavelength band, for example, green and blue. In this case, the lighting device 1000 may control the luminous intensity of the first light emitting device 201, the second light emitting device 202, and the third light emitting device 203. In detail, in the lighting device 1000, the first light emitting device 201 corresponding to the light of the first wavelength band may emit light with high luminous intensity, and the second light emitting device 202 and the third light emitting device 203 corresponding to the light of the second wavelength band may emit light with a lower luminous intensity than that of the first light emitting device 200. That is, the lighting device 1000 may control the light intensity of each of the plurality of light emitting devices 201, 202, and 203 included in the unit light emitting group in consideration of the light transmittance according to the wavelength band of the half mirror layer 610. Accordingly, the light emitted from the lighting device 1000 may have a light spectrum as shown in FIG. 19 and may have a white color.

Accordingly, the lighting device 1000 according to the embodiment may have improved aesthetics. In detail, when the lighting device 1000 is turned on, light of a set color may be emitted outside the lighting device 1000. In this case, the color of light emitted to the outside of the lighting device 1000 may be different from the color of light emitted from the light emitting device 200 due to a difference in transmittance according to a wavelength band of the half mirror layer 610. In addition, when the lighting device 1000 is turned off, the inside of the lighting device 1000 is not recognized from the outside of the lighting device 1000, and the color of the half mirror layer 610 may be recognized. Accordingly, the lighting device 1000 may have improved aesthetics.

FIGS. 20 to 24 are views illustrating examples in which a lamp including a lighting device according to an embodiment is applied to a vehicle.

Figure 20:
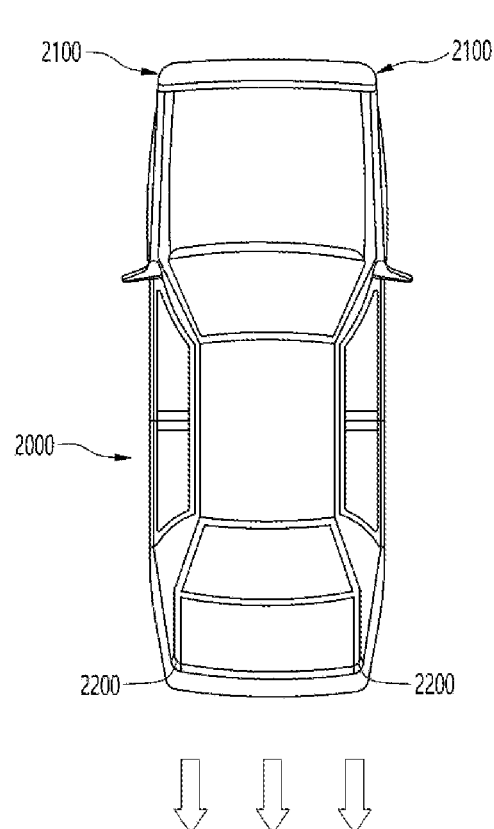
FIGS. 20 to 24 are views illustrating examples in which a lamp including the lighting device according to an embodiment is applied to a vehicle.
Figure 21:
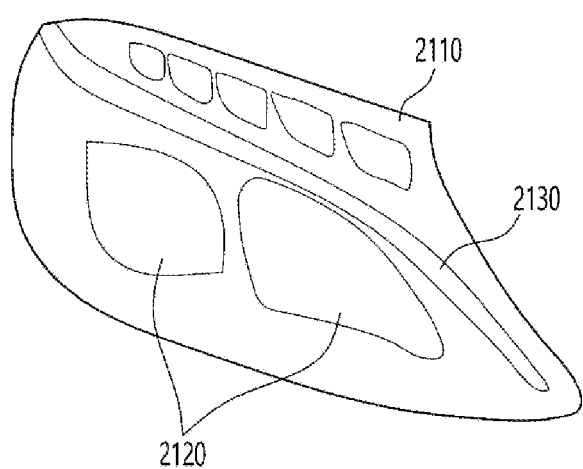
Figure 22:
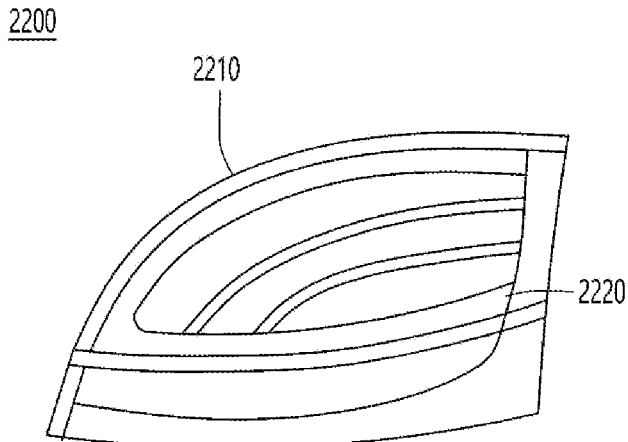
Figure 23:
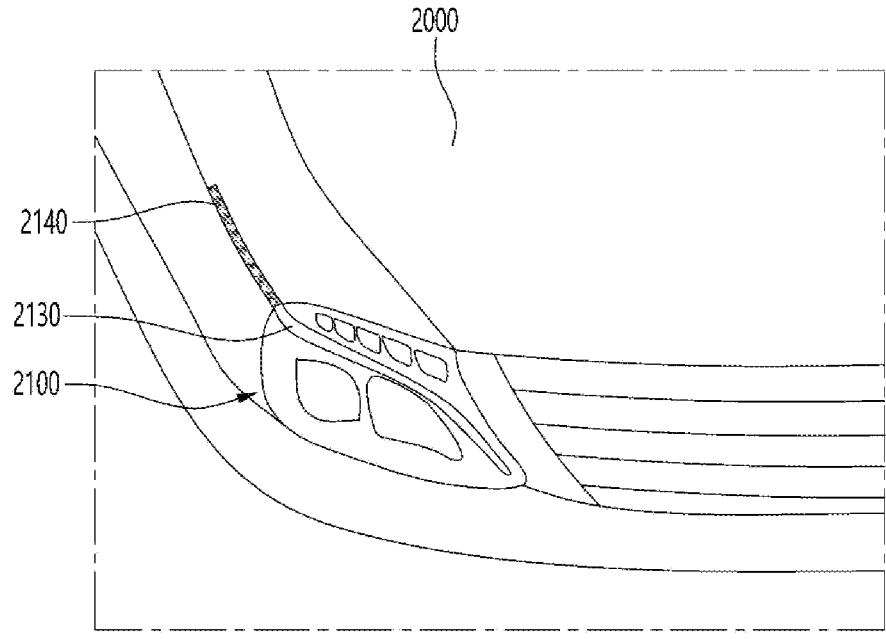
Figure 24:
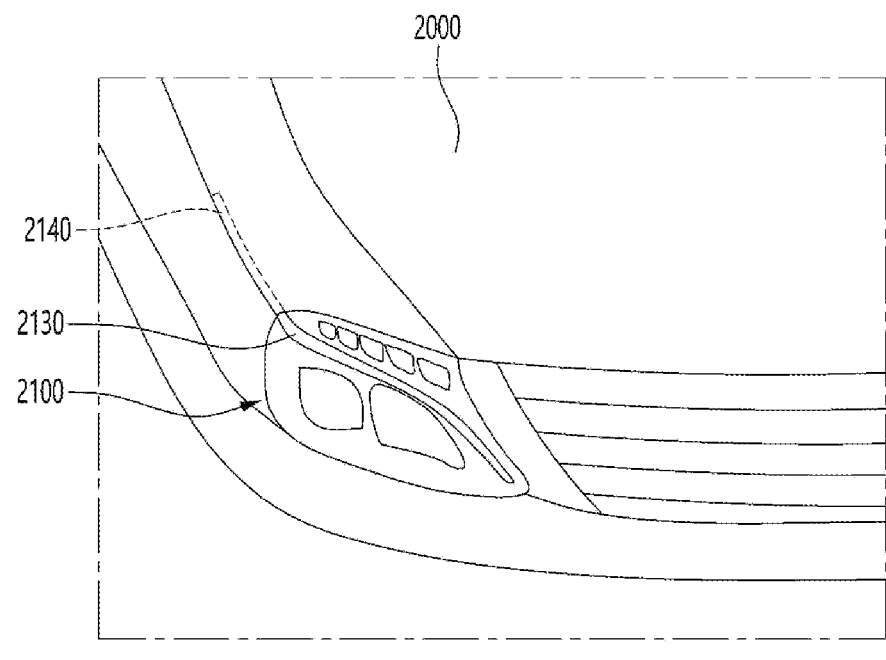

FIG. 20 is a top view of a vehicle to which a lamp having the lighting device is applied. FIG. 21 is an example in which a lighting device according to an embodiment is disposed in front of a vehicle, and FIG. 22 is an example in which a lighting device according to an embodiment is disposed in the rear of a vehicle. In addition, FIGS. 23 and 24 are examples for explaining that the lighting device according to the embodiment operates as a hidden lamp in front of the vehicle.

Referring to FIGS. 20 to 24, a lighting device 1000 according to an embodiment may be applied to a lamp of a vehicle 2000. One or more lamps may be disposed at least one of the front, rear, and side surfaces of the vehicle 2000. The lighting device 1000 is provided in various shapes such as a curve or a straight line, and may be applied to lamps disposed in various regions of the vehicle 2000. For example, referring to FIG. 21, the lamp may be applied to a front lamp 2100 of a vehicle. The front lamp 2100 may include at least one lamp module including the first cover member 2110 and the lighting device. The first cover member 2110 may accommodate the lamp module.

The front lamp 2100 may provide a plurality of functions by controlling the driving timing of the lighting device 1000 included in the at least one lamp module described above. For example, the front lamp 2100 may include a first lamp module 2120 that provides at least one function of a headlight, a turn signal, a daytime running light, a high light, a low light, and a fog light by light emitted from the lighting device 1000 and a third lamp module 2130. In addition, the front lamp 2100 may provide additional functions such as a welcome light or a celebration effect when the driver opens the vehicle door.

Referring to FIG. 22, the lamp may be applied to a rear lamp 2200 of a vehicle. The rear lamp 2200 may include at least one lamp module including the second cover member 2210 and the lighting device 1000. The second cover member 2210 may accommodate the lamp module. The rear lamp 2200 may provide a plurality of functions by controlling the driving timing of the lighting device 1000 included in at least one lamp module. For example, the rear lamp 2200 may include a second lamp module 2220 that provides at least one function of a sidelight, a brake light, and a direction indicator light by light emitted from the lighting device 1000. At least one lamp module of the front lamp 2100 and the rear lamp 2200 may be provided in a color corresponding to that of the vehicle 2000. For example, referring to FIGS. 23 and 24, the front lamp 2100 may further include a fourth lamp module 2140, and the fourth lamp module 2140 may have color corresponding to the vehicle 2000. In detail, as shown in FIG. 23, when the fourth lamp module 2140 is in a turn on state, the fourth lamp module 2140 may emit light of a set wavelength. For example, the fourth lamp module 2140 may provide a function of a daytime running light by emitting white light.

As shown in FIG. 24, when the fourth lamp module 2140 is in a turn off state, the fourth lamp module 2140 may have a color corresponding to or similar to that of the vehicle 2000. For example, the fourth lamp module 2140 may have a color corresponding to or similar to that of the vehicle 2000 in a turn off state by the half mirror layer 610 having a color corresponding to or similar to that of the vehicle 2000. Accordingly, when looking at the fourth lamp module 2140 turned off from the front of the vehicle 2000, the fourth lamp module 2140 may have a hidden effect that is not recognized or may minimize being recognized, thereby having improved aesthetics and design freedom.

Features, structures, effects, etc. described in the embodiments above are included in at least one embodiment of the invention, and are not necessarily limited to only one embodiment. Furthermore, the features, structures, effects, etc. illustrated in each embodiment can be combined or modified with respect to other embodiments by those skilled in the art in the field to which the embodiments belong. Therefore, contents related to these combinations and variations should be construed as being included in the scope of the invention.

In addition, although described based on the embodiments above, this is only an example, not limiting this invention, it will be apparent to those skilled in the art that various modifications and applications not illustrated above can be made without departing from the essential characteristics of this embodiment. For example, each component specifically shown in the embodiment can be modified and implemented. And the differences related to these modifications and applications should be construed as being included in the scope of the invention as defined in the appended claims.

The invention claimed is:

1. A lighting device, comprising:
a reflective layer;
a first resin layer disposed on the reflective layer;
a substrate including of a light-transmitting material and disposed on the first resin layer;
a plurality of light emitting devices disposed between the first resin layer and the substrate;
a second resin layer disposed on the substrate;
a half mirror layer disposed on the second resin layer; and
an optical member disposed between the second resin layer and the half mirror layer, wherein light emitted through a light emitting surface of each of the plurality of light emitting devices includes light in a visible light wavelength band, is reflected by the reflective layer and passes through the substrate, wherein the light in the visible light wavelength band includes a first wavelength band, and a second wavelength band having a different wavelength band from the first wavelength band, wherein the half mirror layer has a reflectance of light in the first wavelength band higher than a transmittance of the light in the first wavelength band, wherein the optical member has a higher transmittance for the light in the first wavelength band than a transmittance for light in the second wavelength band, and wherein a thickness of the second resin layer is smaller than a thickness of the first resin layer.

2. The lighting device of claim 1, wherein the optical member comprises: a first optical layer disposed between the second resin layer and the half mirror layer, and a second optical layer disposed between the first optical layer and the half mirror layer, and wherein the first wavelength band is red.

3. The lighting device of claim 2, wherein the second wavelength band includes a second-first wavelength band and a second-second wavelength band different from the second-first wavelength band, wherein the first optical layer has a transmittance of light in the second-first wavelength band higher than a transmittance of light in the second-second wavelength band, wherein the second optical layer has a transmittance of the light of the second-second wavelength band higher than a transmittance of the light of the second-first wavelength band, wherein the second-first wavelength band is green, and wherein the second-second wavelength band is blue.

4. The lighting device of claim 3, wherein each of the first and second optical layers has a thickness of 150 μm or less.

5. The lighting device of claim 1, wherein each of the plurality of light emitting devices emits white light.

6. The lighting device of claim 1, further comprising a light blocking layer disposed between the substrate and the optical member, wherein the light blocking layer includes a plurality of light blocking patterns formed on at least one of upper and lower surfaces of the light blocking layer, and wherein a portion of the light blocking patterns is disposed in a region overlapping each of the light emitting devices in a vertical direction.

7. The lighting device of claim 6, wherein the light blocking layer is disposed between the second resin layer and the optical member.

8. The lighting device of claim 1, comprising:
a first electrode and a second electrode arranged on the substrate in a mesh shape and electrically connected to the light emitting devices.

9. The lighting device of claim 1, wherein the reflective layer has a thickness of 100 μm to 300 μm, and wherein the reflective layer includes a reflective pattern having a dot shape on an upper surface of the reflective layer.

10. The lighting device of claim 1, wherein a light passing through the half mirror layer includes cyan, and wherein the half mirror layer has a red color.

11. The lighting device of claim 1, wherein the half mirror layer has low transmittance of a red light and high transmittance of green and blue lights.

12. A lighting device, comprising:
a reflective layer;
a first resin layer disposed on the reflective layer;
a substrate including a light-transmitting material and disposed on the first resin layer;
a plurality of light emitting devices disposed between the first resin layer and the substrate;
a second resin layer disposed on the substrate;
a half mirror layer disposed on the second resin layer; and
an optical member disposed between the reflective layer and the first resin layer, wherein the plurality of light emitting devices is spaced apart from each other on a lower surface of the substrate, wherein the substrate is disposed between the first resin layer and the second resin layer, wherein the second resin layer is disposed between the substrate and the half mirror layer, wherein light emitted through a light emitting surface of each of the plurality of light emitting devices includes light in a visible light wavelength band, passes through the optical member and is reflected by the reflective layer to pass through the substrate, wherein the light in the visible light wavelength band includes a first wavelength band, and a second wavelength band having a different wavelength band from the first wavelength band, wherein the half mirror layer has a reflectance of light in the first wavelength band higher than a transmittance of the light in the first wavelength band, wherein the optical member has a higher transmittance for the light in the first wavelength band than a transmittance for light in the second wavelength band, and wherein a thickness of the second resin layer is smaller than a thickness of the first resin layer.

13. The lighting device of claim 12, wherein the optical member comprises: a first optical layer disposed between the reflective layer and the first resin layer, and a second optical layer disposed between the first optical layer and the first resin layer, and wherein the first wavelength band is red.

14. The lighting device of claim 13, wherein the second wavelength band includes a second-first wavelength band and a second-second wavelength band different from the second-first wavelength band, wherein the first optical layer has a transmittance of light in the second-first wavelength band higher than a transmittance of light in the second-second wavelength band, and wherein the second optical layer has a transmittance of the light of the second-second wavelength band higher than a transmittance of the light of the second-first wavelength band, wherein the second-first wavelength band is green, and wherein the second-second wavelength band is blue.

15. The lighting device of claim 12, comprising:
a first electrode and a second electrode arranged on the substrate in a mesh shape and electrically connected to the light emitting devices.

16. The lighting device of claim 12, wherein a light passing through the half mirror layer includes cyan, wherein the half mirror layer has a red color, wherein the half mirror layer has low transmittance of a red light and high transmittance of green and blue lights.

17. A lighting device, comprising:
a reflective layer;
a first resin layer disposed on the reflective layer;
a substrate including a light-transmitting material and disposed on the first resin layer;
a plurality of light emitting devices disposed between the first resin layer and the substrate;
a second resin layer disposed on the substrate; and
a half mirror layer disposed on the second resin layer;
wherein light emitted through a light emitting surface of each of the plurality of light emitting devices includes light in a visible light wavelength band, is reflected by the reflective layer and passes through the substrate, wherein the light emitting device includes first to third light emitting devices disposed adjacent to each other and forming a unit light emitting group, wherein the first light emitting device emits red light, wherein the second light emitting device emits green light, wherein the third light emitting device emits blue light, wherein the light in the visible light wavelength band includes a first wavelength band, and a second wavelength band having a different wavelength band from the first wavelength band, wherein the half mirror layer has a reflectance of light in the first wavelength band higher than a transmittance of the light in the first wavelength band, wherein the substrate is disposed between the first resin layer and the second resin layer, wherein the second resin layer is disposed between the substrate and the half mirror layer, wherein the first to third light emitting devices are disposed on a lower surface of the substrate, wherein a thickness of the second resin layer is smaller than a thickness of the first resin layer.

18. The lighting device of claim 17, wherein when the half mirror layer has a first color corresponding to the first wavelength band and the first color is red, wherein the second light emitting device emits light with a luminous intensity lower than that of the first light emitting device, wherein a light passing through the half mirror layer is white, and wherein the second wavelength band includes at least one of blue and green.

19. The lighting device of claim 17, comprising:
a first electrode and a second electrode arranged on the substrate in a mesh form and electrically connected to the light emitting devices, wherein the reflective layer has a thickness of 100 μm to 300 μm, wherein the reflective layer includes a reflective pattern having a dot shape on an upper surface of the reflective layer.

20. The lighting device of claim 17, wherein the half mirror layer has low transmittance of a red light and high transmittance of green and blue lights.

\* \* \* \* \*